(12) United States Patent
Takasuka

(10) Patent No.: US 7,552,372 B2
(45) Date of Patent: Jun. 23, 2009

(54) SEMICONDUCTOR DEVICE AND TEST METHOD THEREOF

(75) Inventor: Yukitsugu Takasuka, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 396 days.

(21) Appl. No.: 11/455,158

(22) Filed: Jun. 19, 2006

(65) Prior Publication Data

US 2007/0011529 A1 Jan. 11, 2007

(30) Foreign Application Priority Data

Jun. 23, 2005 (JP) ............................. 2005-183630

(51) Int. Cl.
*G01R 31/28* (2006.01)
(52) U.S. Cl. ...................... 714/727; 714/731
(58) Field of Classification Search .............. 324/158.1; 714/744, 724, 726, 727, 719, 731
See application file for complete search history.

(56) References Cited

U.S. PATENT DOCUMENTS

| 6,076,178 | A | * | 6/2000 | Komoda | 714/727 |
| 6,079,039 | A | * | 6/2000 | Nakamura | 714/726 |
| 6,374,380 | B1 | * | 4/2002 | Sim | 714/727 |
| 6,731,106 | B2 | * | 5/2004 | Whetsel | 324/158.1 |
| 2004/0199838 | A1 | * | 10/2004 | Rutkowski et al. | 714/724 |
| 2005/0015689 | A1 | * | 1/2005 | Eppensteiner et al. | 714/724 |

FOREIGN PATENT DOCUMENTS

| JP | 3072718 | 6/2000 |
| JP | 2003-337157 | 11/2003 |

* cited by examiner

*Primary Examiner*—David Ton
(74) *Attorney, Agent, or Firm*—McGinn IP Law Group, PLLC

(57) ABSTRACT

An LSI has bidirectional buffers connected to a boundary scan circuit. The boundary scan circuit 12 has asynchronous setting circuits for setting each bidirectional buffer to input mode or output mode. The bidirectional buffers are asynchronously and uniformly set to output mode to detect a logic error. If there is no logic error, input/output terminals which are respectively connected to the bidirectional buffers are integrated and the bidirectional buffers are asynchronously and uniformly fixed to input mode. After setting a set value for setting a desired enable state to the boundary scan circuit, the uniform input mode is released asynchronously. Then, the boundary scan circuit implements DC test.

20 Claims, 21 Drawing Sheets

Fig. 5

|  | COMMON ITEMS ||| SCAN TEST |||| BSCAN (Extest) TEST ||||
| --- | --- | --- | --- | --- | --- | --- | --- | --- | --- |
|  | ENMODE | ENCNT | 14b | MODE1 | 14a | 14c | MODE1 | 14a | 14c |
| OPEN STATE = OUTPUT FIXED | 0 | 1 | 1 | 0 | 0 | x | 1 | 1 | 0 |
| INTEGRATION STATE = INPUT FIXED | 0 | 0 | 0 | 0 | x | x | 0 | x | x |
| BSCAN Extest MODE | 1 | x | 1 | 1 | MODE1 | 0 | 1 | MODE1 | 0 |
| NORMAL | 1 | x | 0 | 0 | MODE1 | x | 0 | MODE1 | x |

SEMICONDUCTOR DEVICE AND TEST METHOD THEREOF

BACKGROUND OF THE INVENTION

1. Field of the Invention

The present invention generally relates to a DC test circuit and a test method of a semiconductor device and particularly relates to a semiconductor device and a test method that implement test by short-circuiting a plurality of LSI signal terminals to make a connection with an LSI tester.

2. Description of Related Art

The number of LSI signal terminals is on the increase recently. On the other hand, the number of tester terminals of an LSI tester does not keep up with the ever increasing signal terminals. Particularly, an LSI tester is highly expensive, and use of a multiple pin LSI tester directly affects product test costs, which is thus not easy. Consequently, various techniques to enable testing by assigning a small number of tester terminals to a larger number of LSI signal terminals have been investigated.

Normally, an LSI signal terminal (which is referred to hereinafter as the "external terminal") and an LSI tester terminal (hereinafter as the "tester terminal") are connected one to one to test an LSI. On the other hand, there is proposed a technique that short-circuits (hereinafter as "integrates") a plurality of external terminals outside the LSI by jig tool and connects the integrated terminals to one tester terminal. This technique then activates one test target external terminal by turning an enable (EN) value of input/output mode to ON and thereby tests the terminals one by one. This technique is described in Japanese Patent No. 3072718 and Japanese Unexamined Patent Application Publication No. 2003-337157, for example.

The ON/OFF value of EN is arbitrary for each LSI or interface (I/F) buffer. In this specification, ON (output mode) of the EN value is "1" and OFF (input mode) is "0".

FIG. 17 is a circuit diagram that shows the entire part of a boundary scan (BSCAN) circuit of a related art. As shown in FIG. 17, the LSI of the related art includes an internal logic circuit 102 for implementing desired functions and data input/output (I/O) circuits 111a, 111b and 111c, formed on an LSI substrate 101. The data I/O circuit 111a includes a bidirectional buffer 200 that transmits a logic signal with the outside of LSI, and a BSCAN circuit 210. The BSCAN circuit 210 includes a data side BSCAN register 115a, a data side Update latch 116a, an EN side BSCAN register 115b, an EN side Update latch 116b, selectors 114a to 114c, and an AND gate (AND circuit) 118.

An LSI external terminal IO1 that is connected to a bidirectional terminal A of the bidirectional buffer 200 is short-circuited (integrated) with another external terminals IO2 and IO3 by an LSI tester (not shown) outside the LSI or a jig 220 for connecting the LSI substrate 101 and the tester terminal.

The bidirectional buffer 200 and the BSCAN circuit 210 are connected as follows. A data input terminal B of the bidirectional buffer 200 is connected to the output of a selector 114a, an EN input terminal C of the bidirectional buffer 200 is connected to the output of a selector 114b, and a data output terminal D of the bidirectional buffer 200 is connected to the input NO2 of the internal logic circuit 102. The input NO2 is also connected to a selection input with a switching input value "0" of a selector 114c.

One input (logical inversion input) of the AND circuit 118 receives a BSCAN control signal MODE1 from a test access port (TAP) circuit 110, the other input is connected to the output of the selector 114b, and the output is connected to a switching input of the selector 114c. In the selector 114c, the selection input with the switching input value "0" is connected to the output HO1 of the internal logic circuit 102, and the selection input with the switching input value "1" is connected to the output of the data side Update latch 116a. The switching input of the selector 114a receives a BSCAN control signal MODE1 from the TAP circuit 110, and the output of the selector 114a is connected to the data input terminal B of the bidirectional buffer 200 and the selection input with the switching input value "1" of the selector 114c.

In the selector 114b, the selection input with the switching input value "0" is connected to the output HO3 of the internal logic circuit 102, and the selection input with the switching input value "1" is connected to the output of the EN side Update latch 116b, the switching input receives a BSCAN control signal MODE1 from the TAP circuit 110, and the output is connected to the EN input terminal C of the bidirectional buffer 200.

In the selector 114c, the selection input with the switching input value "0" is connected to the data output terminal D of the bidirectional buffer 200, the selection input with the switching input value "1" is connected to the output of the selector 114a. Further, the switching input of the selector 114c is connected to the output of the AND circuit 18, and the output of the selector 114c is connected to the PIN input of the data side BSCAN register 115a.

A PIN input of the data side BSCAN register 115a is connected to the output of the selector 114c, a SFDR input thereof receives a BSCAN control signal SFDR from the TAP circuit 110, a CLKDR input thereof receives a BSCAN control signal CLKDR from the TAP circuit 110, and a POUT output thereof is connected to the data input of the data side Update latch 116a. Further, a BSIN input of the data side BSCAN register 115a is connected to a BSOUT of the EN side BSCAN register 115b, and a BSOUT output thereof is connected to BS_SIN of the TAP circuit 10.

A PIN input of the EN side BSCAN register 115b is connected to the output H03 of the internal logic circuit 102, a SFDR input thereof receives a BSCAN control signal SFDR from the TAP circuit 110, a clock input (GB=CLKDR) thereof receives a BSCAN control signal CLKDR from the TAP circuit 110, and a POUT output thereof is connected to the data input of the EN side Update latch 116b. Further, a BSIN input of the EN side BSCAN register 115b is connected to a BSOUT of the data I/O circuit 111b, and a BSOUT output thereof is connected to a BSIN input of the data side BSCAN register 115a.

The data input of the data side Update latch 116a is connected to the POUT output of the data side BSCAN register 115a, the clock input (G=UPDDR) thereof is connected to UPDDR of the TAP circuit 110, and the output thereof is connected to the selection input with the switching input value "1" of the selector 114a.

The data input of the EN side Update latch 116b is connected to the POUT output of the EN side BSCAN register 115b, the clock input (G=UPDDR) thereof is connected to UPDDR of the TAP circuit 110, and the output thereof is connected to the selection input with the switching input value "1" of the selector 114b.

The data I/O circuits 111b and 111c each have the similar circuits such as the data side and the EN side BSCAN registers. The BSOUT output of the data side BSCAN register (not shown) of the data I/O circuit 111b is connected to the BSIN input of the EN side BSCAN register 115b of the data I/O circuit 111a. The BSIN input of the EN side BSCAN register (not shown) of the data I/O circuit 111b is connected to the BSOUT output of the data side BSCAN register (not shown) of the data I/O circuit 111c.

The BSOUT output of the data side BSCAN register (not shown) of the data I/O circuit 111c is connected to the BSIN input of the EN side BSCAN register (not shown) of the data I/O circuit 111b. The BSIN input of the EN side BSCAN register (not shown) of the data I/O circuit 111c is connected to BS_SOUT of the TAP circuit 110. The other elements in the data I/O circuits 111b and 111c are connected in the same manner as those in the data I/O circuit 111a.

Test operation of a related art is described herein. FIG. 18 is a flowchart showing test operation according to a related art. FIG. 19 is a flowchart showing a detail of Step S105 in FIG. 18. FIGS. 20 and 21 are views to describe the test operation of a related art. The circuit shown in FIG. 20 includes a three-state (3st) output buffer 203 having three states of "1", "0" and "High-Z (high impedance)", instead of the bidirectional buffer 200 of the data input circuit 111a of FIG. 17. This circuit omits the AND circuit 118 of the BSCAN circuit 210, the control signals SFDR, CLKDR, UPDDR and MODE1 of the TAP circuit 110, and the TAP circuit 110. Referring to FIGS. 20 and 21, in the data input circuits 111a, 111b and 111c, "X" in the input and the EN side BSCAN registers indicates the value of "1" or "0", and "1" or "0" in each Update latch indicates the value which is held during DC test. The BSCAN operation, including the state transition in the TAP circuit 110 (=mode change), is defined by IEEE1149.1 and well known to those skilled in the art, and therefore the detail of the operation is not described herein.

Referring first to FIG. 18, the process integrates (short-circuits) external terminals IO1 to IO3, which are LSI test target terminals, by a jig tool 220 (S101 in FIG. 18) and turns on power (S102 in FIG. 18). In the following description, the external terminals to be integrated are referred to herein as the "integration terminal group", and the number of integrated external terminals is N. The process then sets BSCAN to Extest mode (S103), controls EN values sequentially and performs DC test of the 3st buffer 203 of the data input circuit 111a and the bidirectional buffers 200 of the data input circuits 111b and 111c (S104 and S105). Further, the process detects errors in the internal logic circuit 102 by a functional test pattern such as a scan path (hereinafter as SCAN) while controlling the EN values, thereby performing error detection (operational test) of the circuits including the input/output/bidirectional buffers by BSCAN (S106).

The BSCAN in S103 uses Extest mode. The Extest mode disconnects the transmission of the output of the LSI internal logic circuit 102 to the bidirectional buffers at the selectors 114a and 114b. Then, the value of the BSCAN register 115a which are sequentially shift-input (ShI/Ft_DR) through the BSCAN data input terminal TDI is read into the Update latch 116a and output to the bidirectional buffer 200 (Update_DR), or the values input to the bidirectional buffer 200 is captured (Capture_DR) through the selector 114c to the EN side BSCAN resistor 115b and sequentially shift-output (ShI/Ft_DR) to the terminal TDO. The BSCAN data input terminal TDI is a terminal for inputting a set value from the outside of the LSI to the BSCAN register. The terminal TDO is a terminal for outputting the value of the EN side BSCAN register 115b to the outside of the LSI.

FIG. 22 is a view showing a detail of the BSCAN circuit of the bidirectional buffer 200. In this case, the value of MODE1 supplied from the TAP circuit is fixed to "1" during Extest mode while it is fixed to "0" in other times.

The DC test implemented by the 3st output buffer and the bidirectional buffer 200 in Step S105 of FIG. 18 is described hereinafter in detail. As shown in FIG. 19, the process determines whether to initialize the setting or not (S111). "n" indicates any of the N number of external terminals which are included in the integration target terminal group. When performing initialization, the process sets n=0 and proceeds to Step S112. The value of "n" is 0, 1, . . . , N and the termination condition, which is described later, is n=N.

Then, "0" is shift-input to the EN side BSCAN register 115b through the BSCAN data input terminal TDI so as to set the EN value of all the selectors 114a to OFF (S112), and further "0" is shift-input to the data side BSCAN register 115a through the BSCAN data input terminal TDI. After setting "0" to the BSCAN registers 115a and 115b, the values of the BSCAN registers 115a and 115b are read into the Update latches 116a and 116b. Then, TAP mode is changed from Shift_DR, then Exite_DR to Update_DR, and thereby set to Update_DR (S114). After that, the values of the BSCAN registers 115a and 115b are read into the Update latches 116a and 116b (S115).

Then, TAP mode is changed from Update_DR, then Select_DR_scan, Capture_DR to Shift_DR, and thereby set to Shift_DR (S117). Consequently, the EN values of all of the 3st output buffer 203 and the bidirectional buffer 200 are set to OFF.

Then, DC test is implemented under the state where the EN values of all the 3st output buffer 203 and the bidirectional buffer 200 are OFF (S117). After the test, if the number n of current test target external terminals does not reach the number N of integration terminals or if the termination condition is not satisfied (NO in S118), the process increments the value of n and designates the next test target terminal (buffer) (S119). Then, the process sequentially inputs a value through the BSCAN data input terminal TDI so that the EN value of the test target buffer 200 only is set to ON and thereby sets a set value "1" to the BSCAN register 115a (S113). A series of operation from S112 to S116 is the operation of Extest mode of BSCAN, which sets DC test conditions to the 3st output buffer and the bidirectional buffer and implements DC test. This process is repeated until the DC test on all of the 3st output buffer 203 and the bidirectional buffer 200 is completed.

However, the above-described technique has the following problems. First, the short-circuit which occurs between the external terminals of different integration terminal groups can be detected just like the case where an external terminal and a tester terminal are connected one to one. However, if the short-circuit occurs between the terminals of the same integration terminal group as shown in FIG. 20, this error is undetectable in principle. Because the short-circuit path is configured outside the LSI by design using the integration jig tool 220, the short-circuit error and the short-circuit for integration cannot be distinguished, thus failing to detect the short-circuit error.

In a conventional test method where an external terminal and a tester terminal are connected one to one, one technique of test for detecting a short-circuit error is to perform short-circuit detection by setting different conditions for test target terminals and for other terminals. For example, after setting VDD=GND, this technique supplies a signal of 0.1V to the terminals other than a test target terminal and detects the occurrence of short-circuit (path) based on observation of current at the test target terminal. However, if external terminals are integrated as in the above-described test method, it is unable to set different conditions for different terminals and an integrated path (short-circuit path) exists outside the LSI, and therefore it is impossible to detect the occurrence of short-circuit error in the same integration group by test.

A second problem is as follows. When a plurality of degeneracy errors where a logic is fixed to "1" or "0" occur in the same integration target terminal group or when multiple errors occur in the integration terminal group as shown in FIG. 21, if at least one of the errors causes logic fixation to "1" (formation of a path reaching VDD) and at least one causes logic fixation to "0" (formation of a path reaching GND), VDD–GND short-circuit occurs by the integration jig tool 220 upon application of power and connection of the integration jig tool 220, which causes excessive current flow.

If an external terminal and a tester terminal are connected one to one as in the conventional test method, the above-described current path is not formed even if the 3st output buffer with a high driving force or the bidirectional buffer contains an error. However, if the terminals are integrated outside the LSI by the jig tool 220 as in the above-described test method, the above current path is formed due to multiple errors. Excessive current thereby flows through the current path, which can cause breakdown of a jig tool such as a probe card.

A third problem is as follows. Though a condition for stable implementation of test is to set only one terminal at most in each integration target terminal group to output mode, it is unable to satisfy this condition after power-on until the completion of EN value setting by BSCAN operation, which causes VDD–GND short-circuit to occur.

As shown in FIGS. 18 and 19, in order to set the EN values of the 3st output buffer 203 and the bidirectional buffer 200 by BSCAN operation after integrating the external terminals outside the LSI by a jig in S101 and turning on the power in S102, the following series of process is required. First, the mode is set to Extest mode in S103 after resetting the BSCAN circuit. Then, in S112, a desired EN value is sequentially shifted to the BSCAN register through the BSCAN data input terminal TDI. Further, after completing the shift, Update_DR operation is performed in S114, and the EN value is set.

The operation for setting to Extest mode after resetting the BSCAN circuit (S103) requires several patterns (clocks). Further, the sequential shifting of a desired EN value to the BSCAN register through the BSCAN data input terminal TDI (S112) requires at least the same number of patterns (clocks) as the number of BSCAN registers. Thus, even the configuration of FIG. 17 that uses two BSCAN registers (BSCAN registers 115a and 115b) for the bidirectional buffer requires 1000 patterns (clocks) if there are 500 bidirectional terminals, for example. As a result, a time to set the EN value is not a temporary short time immediately after power-on but takes a long time.

As described in the foregoing, the present invention has recognized that when it is impossible to detect whether an EN value is settled at "0" or "1" upon power-on until completion of EN value setting and when integration target terminals with the output buffers such as the bidirectional buffer 200 and the 3st output buffer 203 are integrated, if one outputs "1" while the other outputs "0", a path of VDD–GND short-circuit is formed to cause breakdown of a jig tool such as a probe card as in the second problem.

SUMMARY OF THE INVENTION

According to one aspect of the present invention, there is provided a test method of a semiconductor device having bidirectional buffers connected to a boundary scan circuit, which includes detecting a logic error by setting the bidirectional buffers uniformly to output mode by an asynchronous setting circuit for asynchronously setting the bidirectional buffers to input mode or output mode, if there is no logic error, integrating a plurality of input/output terminals connected to the bidirectional buffers and fixing the bidirectional buffers with the integrated input/output terminals uniformly to input mode by the asynchronous setting circuit, setting a set value for setting the bidirectional buffers to desired enable state to the boundary scan circuit and releasing the uniform input mode by the asynchronous setting circuit, and implementing DC test by the boundary scan circuit with the input/output terminals being integrated.

The method first sets the bidirectional buffers asynchronously and uniformly to output mode and detects a logic error in each bidirectional buffer. This enables detection of the error that is undetectable in principle by DC test with input/output terminals being integrated, which is short-circuit error between input/output terminals included in an integrated input/output terminal group or multiple degeneracy errors of the bidirectional buffers. After that, the plurality of input/output terminals connected to the bidirectional buffers are integrated into one, and the bidirectional buffers of the integrated input/output terminals are asynchronously and uniformly set to input mode until a desired set value is set to the boundary scan circuit. Thus, in the implementation of DC test by the boundary scan circuit, stable conditions where the bidirectional buffers are fixed to output mode can be kept until input of a set value to the scan circuit to complete the settings.

According to another aspect of the present invention, there is provided a semiconductor device which includes an internal circuit, a plurality of bidirectional buffers, and a boundary scan circuit connected between the internal circuit and the plurality of bidirectional buffers, wherein the boundary scan circuit comprises an asynchronous setting circuit for asynchronously setting the bidirectional buffers to input mode or output mode.

In this device, the bidirectional buffers can be asynchronously set to input mode or output mode by the asynchronous setting circuit. Thus, when testing the semiconductor device, the asynchronous setting circuit first fixes the bidirectional buffers to output mode and detects a logic error in each bidirectional buffer. If there is an error, it removes the semiconductor device. If, on the other hand, there is no error, the plurality of input/output terminals connected to the bidirectional buffers are integrated into one and connected to a tester for DC test. At this time, while setting a set value to be set to the bidirectional buffers to the boundary scan circuit, the bidirectional buffers can be asynchronously and uniformly set to input mode. It is thereby possible to start the DC test by the boundary scan circuit with the plurality of input/output terminal being integrated under stable conditions, thus enabling stable and accurate error detection in the semiconductor device.

The present invention provides the semiconductor device and the test method which can detect short-circuit between integrated terminals or multiple errors and thereby perform stable test even when input/output terminal are integrated.

BRIEF DESCRIPTION OF THE DRAWINGS

The above and other objects, advantages and features of the present invention will be more apparent from the following description taken in conjunction with the accompanying drawings, in which:

FIG. 5 is a view showing a truth table of the signals input to the circuit shown in FIG. 2;

FIG. 6 is a view showing the state where the bidirectional buffer is asynchronously fixed to output mode and power is ON;

FIG. 7 is a view showing the state where the bidirectional buffer is asynchronously fixed to output mode and power is ON;

FIG. 10 is a view showing a state where the mode is asynchronously fixed to input mode and power is ON;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
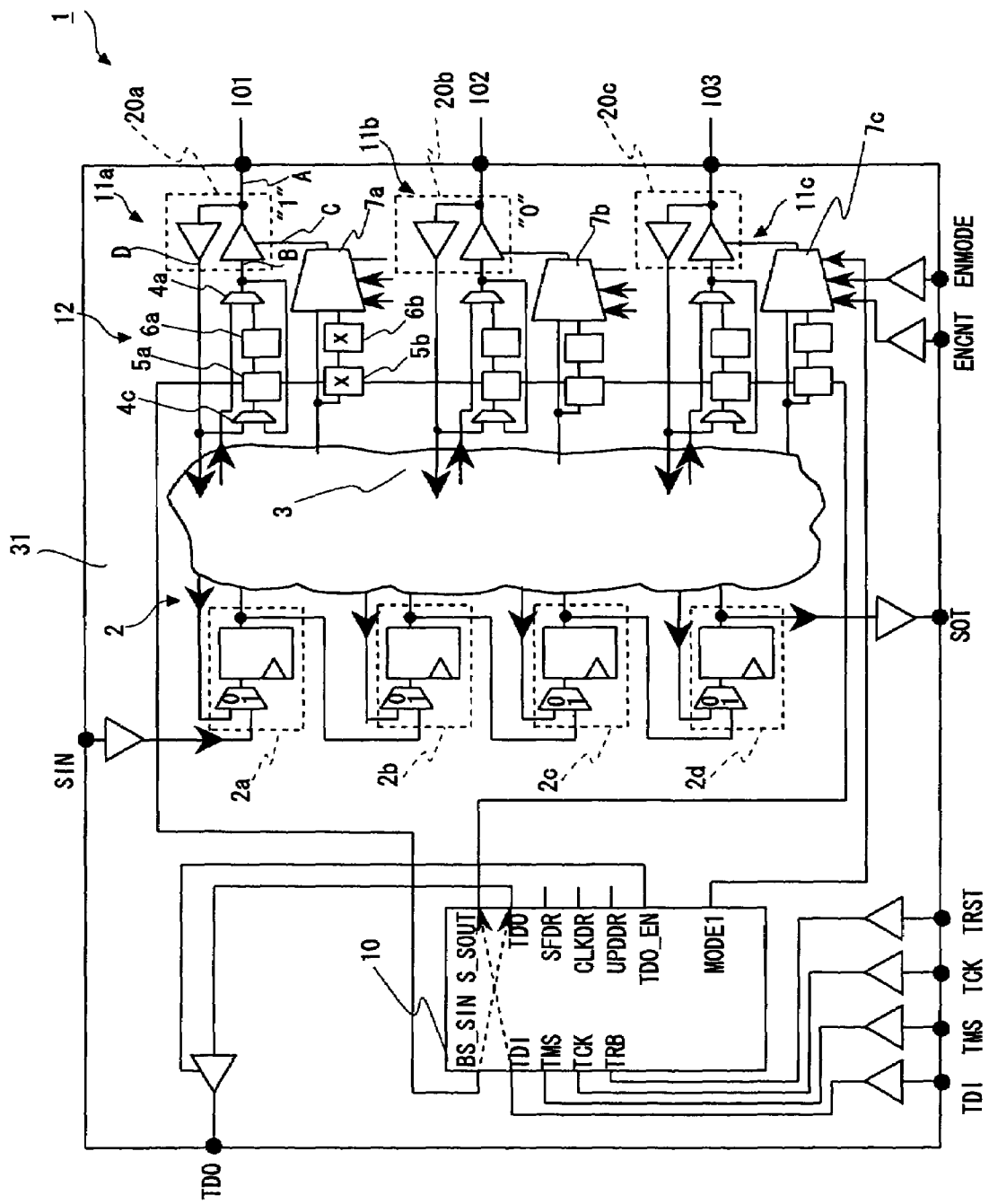
FIG. 1 is a circuit diagram showing a semiconductor device (LSI) according to a first embodiment of the invention.

FIG. 1 is a circuit diagram showing a semiconductor device (hereinafter referred to as "LSI") according to a first embodiment of the invention. Referring to FIG. 1, an LSI 1 includes, on an LSI substrate 31, an internal logic circuit 2 for implementing desired functions and data I/O circuits 11a to 11c connecting the internal logic circuit 2 with external terminals IO1, IO2 and IO3. The internal logic circuit 2 includes SCAN-FF 2a, 2b, 2c and 2d which constitute a SCAN circuit and a combinational circuit 3.

The data I/O circuits 11a to 11c have a BSCAN circuit 12 and bidirectional buffers 20a to 20c, respectively. Each BSCAN circuit 12 has an asynchronous EN controllers 7a to 7c. The BSCAN circuit 12 is detailed later. The outputs of the asynchronous EN controllers 7a to 7c are connected to the EN input terminals C of the bidirectional buffers 20a to 20c, respectively. The inputs of the asynchronous EN controllers 7a to 7c are connected to the outputs of the combinational circuit 3 and the outputs of the EN side Update latches 6b, respectively. The asynchronous EN controllers 7a to 7c are further connected to an asynchronous EN control switch terminal ENMODE, an asynchronous EN I/O control terminal ENCNT and an output MODE1 of a TAP circuit 10 to receive each control signal.

The SCAN-FF 2a receives a SIN signal through a SCAN data input terminal SIN for inputting a set value to SCAN-FF from outside the LSI and the output from the combinational circuit 3 and supplies its output to the combinational circuit 3 and the SCAN-FF 2b. The SCAN-FF 2b receives the output of the SCAN-FF 2a and the output of the combinational circuit 3 and supplies its output to the combinational circuit 3 and the SCAN-FF 2c. The SCAN-FF 2c receives the output of the SCAN-FF 2b and the output of the combinational circuit 3 and supplies its output to the combinational circuit 3 and the SCAN-FF 2d. The SCAN-FF 2d receives the output of the SCAN-FF 2c and the output of the combinational circuit 3 and supplies its output, which is the value of SCAN-FF, to the combinational circuit 3 and a SCAN data output terminal SOT for outputting a value to outside the outside LSI.

Figure 2:
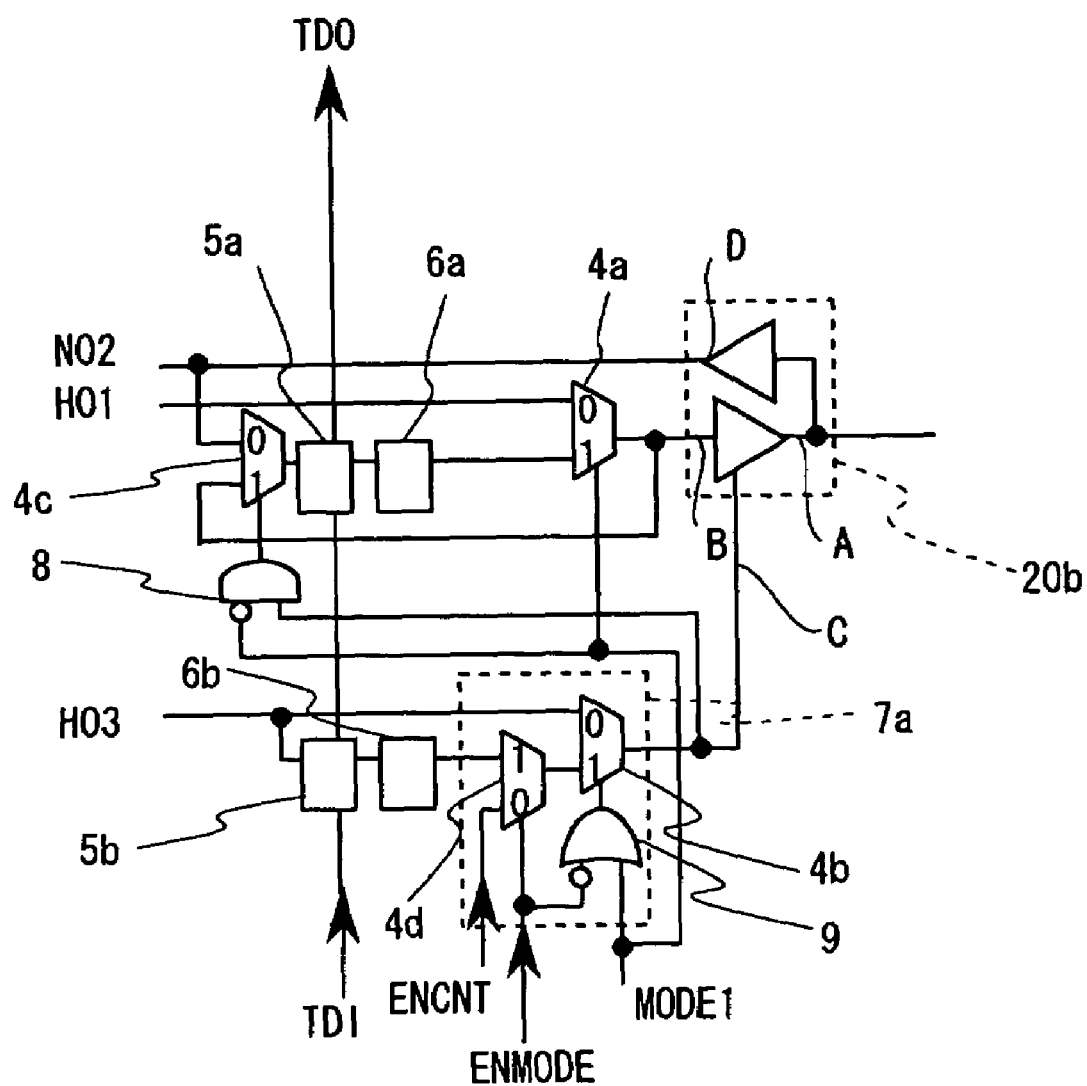
FIG. 2 is a circuit diagram showing a detail of a BSCAN circuit including an asynchronous EN controller according to the first embodiment of the invention.

The BSCAN circuit 12 which includes the asynchronous EN controllers 7a to 7c is described hereinafter in detail. Though the following description is given on the asynchronous EN controller 7a, the asynchronous EN controllers 7b and 7c are configured in the same way. FIG. 2 is a circuit diagram showing a detail of the BSCAN circuit 12 which has the asynchronous EN controller 7a. As shown in FIG. 2, the asynchronous EN controller 7a includes a selector 4b, a selector 4d and an OR circuit 9.

The asynchronous EN controller 7a is connected to an asynchronous EN control switch terminal, an asynchronous EN I/O control terminal, and a BSCAN control terminal to receive an asynchronous EN control switch signal ENMODE, an asynchronous EN I/O control signal ENCNT and a BSCAN control signal MODE1, respectively. The asynchronous EN control switch signal ENMODE controls whether to fix an EN value asynchronously. The asynchronous EN I/O control signal ENCNT controls by switching between input mode and output mode when EN is fixed by the asynchronous EN control switch signal ENMODE. Though these control values may be determined arbitrarily, the case where EN is asynchronously fixed when the asynchronous EN control switch signal ENMODE=0 and the mode is set to input mode when the asynchronous EN I/O control signal ENCNT=0 is described hereinafter on the ground of transient state with power ON.

The selection input with the switching input value "0" of the selector 4b is connected to the output H03 of the internal logic circuit 2, and the selection input with the switching input value "1" of the selector 4b is connected to the output of the selector 4d. The switching input of the selector 4b is connected to the output of the OR circuit 9. The output of the selector 4b is connected to the EN input terminal C of the bidirectional buffer 20a and one input (non-inverting input) of the AND circuit 8.

The OR circuit 9 receives the asynchronous EN control switch signal ENMODE at one input (inverting input) and the BSCAN control signal MODE1 at the other input (non-inverting input).

The selection input with the switching input value "0" of the selector 4d receives the asynchronous EN I/O control signal ENCNT, and the selection input with the switching input value "1" of the selector 4d is connected to the output of the EN side Update latch 6b. The switching input of the selector 4d receives the asynchronous EN control switch signal ENMODE.

The other elements including the TAP circuit 10 are the same as the equivalents in the conventional test circuit. Specifically, as shown in FIG. 1, the LSI external terminal IO1 connected to the bidirectional terminal A of the bidirectional buffer 20a is short-circuited (integrated) with another external terminal by a jig (not shown) that connects the LSI substrate 31 and a tester terminal.

In the bidirectional buffer 20a, the data input terminal B is connected to the output of the selector 4a, the EN input terminal C is connected to the output of the asynchronous EN controller 7a, and the data output terminal D is connected to the input NO2 of the internal logic circuit 2. The input NO2 is also connected to the selection input with a switching input value "0" of the selector 4c.

In the AND circuit 8, one input (inverting input) thereof receives the BSCAN control signal MODE1 from the TAP circuit 10, the other input thereof is connected to the output of the asynchronous EN controller 7a, and the output thereof is connected to the switching input of the selector 4c. In the selector 4a, the selection input with the switching input value "0" is connected to the output HO1 of the internal logic circuit 2, the selection input with the switching input value "1" is connected to the output of the data side Update latch 6a, the switching input receives the BSCAN control signal MODE1 from the TAP circuit 10, and the output is connected to the data input terminal B of the bidirectional buffer 20a and the selection input with the switching input value "1" of the selector 4c.

In the selector 4c, the selection input with the switching input value "0" is connected to the data output terminal D of the bidirectional buffer 20a, the selection input with the switching input value "1" is connected to the output of the selector 4a, the switching input is connected to the output of the AND circuit 8, and the output is connected to PIN of the data side BSCAN register 5a.

In the data side BSCAN register 5a, PIN input is connected to the output of the selector 4c, POUT output is connected to the data input of the data side Update latch 6a, BSIN input is connected to BSOUT output of the EN side BSCAN register 5b, and BSOUT output is connected to BS_SIN of the TAP circuit 10.

In the EN side BSCAN register 5b, PIN input is connected to the output HO3 of the internal logic circuit 2, POUT output is connected to the data input of the EN side Update latch 6b, BSIN input is connected to BSOUT output of the data I/O circuit 11b, and BSOUT output is connected to BSIN input of the data side BSCAN register 5a.

In the data side Update latch 6a, the data input thereof is connected to POUT output of the data side BSCAN register 5a, and the output is connected to the selection input with a switching input value "1" of the selector 4a. In the EN side Update latch 6b, the data input thereof is connected to POUT output of the EN side BSCAN register 5b, and the output is connected to the selection input with the switching input value "1" of the selector 4b.

The data I/O circuits 11b and 11c have the similar circuits including the data side and the EN side BSCAN registers. BSOUT output of the data side BSCAN register 5a in the data I/O circuit 11b is connected to BSIN input of the EN side BSCAN register 5b in the data I/O circuit 11a. BSIN input of the EN side BSCAN register 5b in the data I/O circuit 11b is connected to BSOUT output of the data side BSCAN register 5a in the data I/O circuit 11c.

Further, BSOUT output of the data side BSCAN register 5a in the data I/O circuit 11c is connected to BSIN input of the EN side BSCAN register 5b in the data I/O circuit 11b. BSIN input of the EN side BSCAN register 5b in the data I/O circuit 11c is connected to BS_SOUT of the TAP circuit 10. The other elements in the data I/O circuits 11b and 11c are connected in the same way as those in the data I/O circuit 11a.

The TAP circuit 10 is a state machine for controlling the state transition of the BSCAN circuit. The TAP circuit 10 shifts the state diagram in response to two signals of Test Clock Input (TCK) and Test Mode Select Input (TMS). The test and control signals are thereby supplied to the BSCAN circuit. TCK is a clock signal for clocking of all test operations and scan operations. TMS is a control signal for selecting test mode. Test Data Input (TDI) is an input of test data, which is formed of serial shift data. Test Data Output (TDO) is an output of test data, which is formed of serial shift data. Test Reset Input (TRST) is a signal for resetting the TAP circuit 10 asynchronously.

Clock DR (CLKDR) is a clock signal for the BSCAN circuit and changes in the same manner as TCK in accordance with TCK. Update DR (UPDDR) holds the latches in the BSCAN circuit at current state during shift operation. Shift DR (SFDR) controls loading of data to the register in the BSCAN circuit and shift cycle. Enable (TDO_EN) controls the try state output output buffer of TDO. MODE1 controls Extest mode of BSCAN operation.

Figure 3:
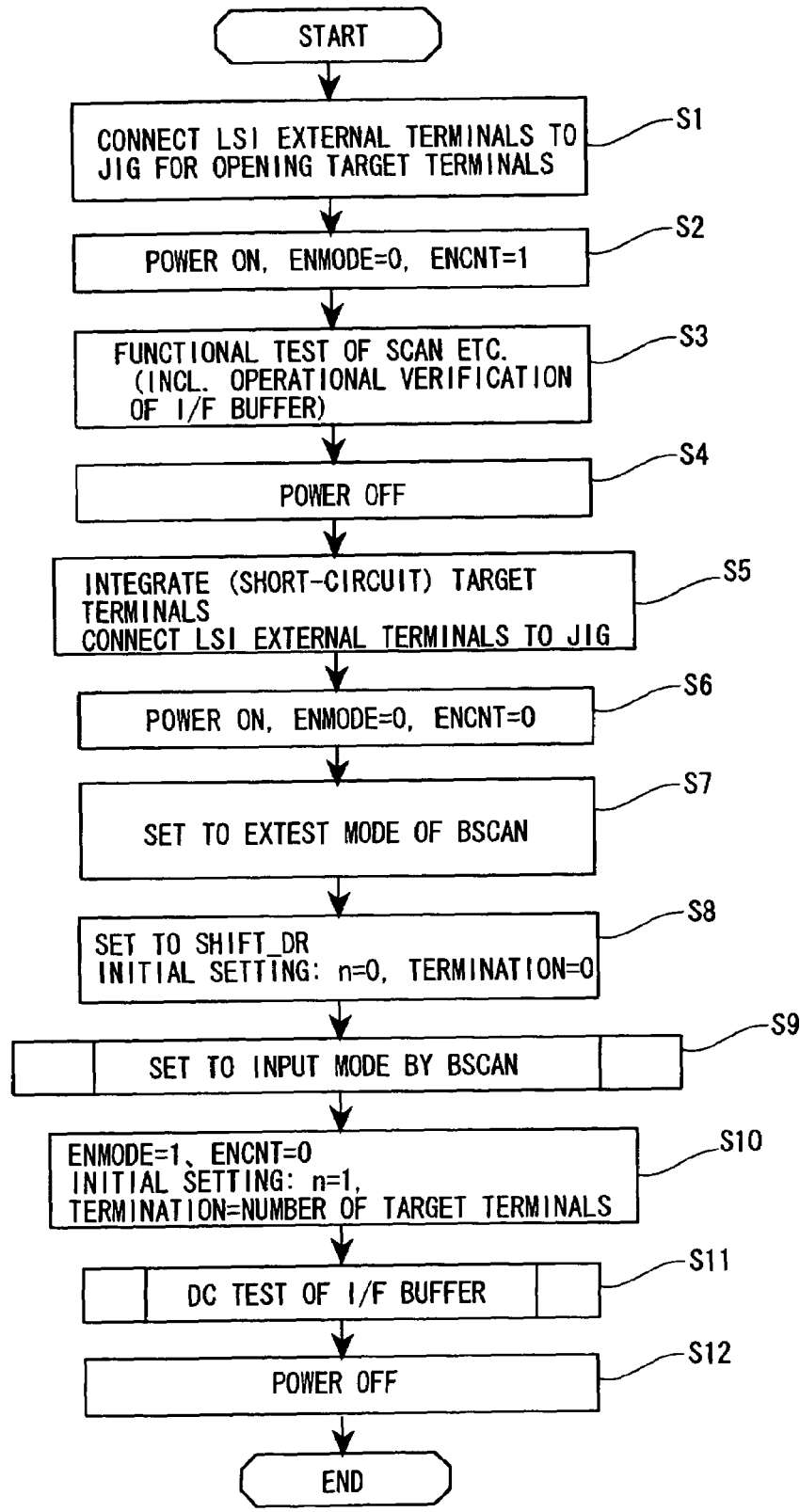
FIG. 3 is a flowchart showing DC test operation according to the first embodiment of the invention.
Figure 4:
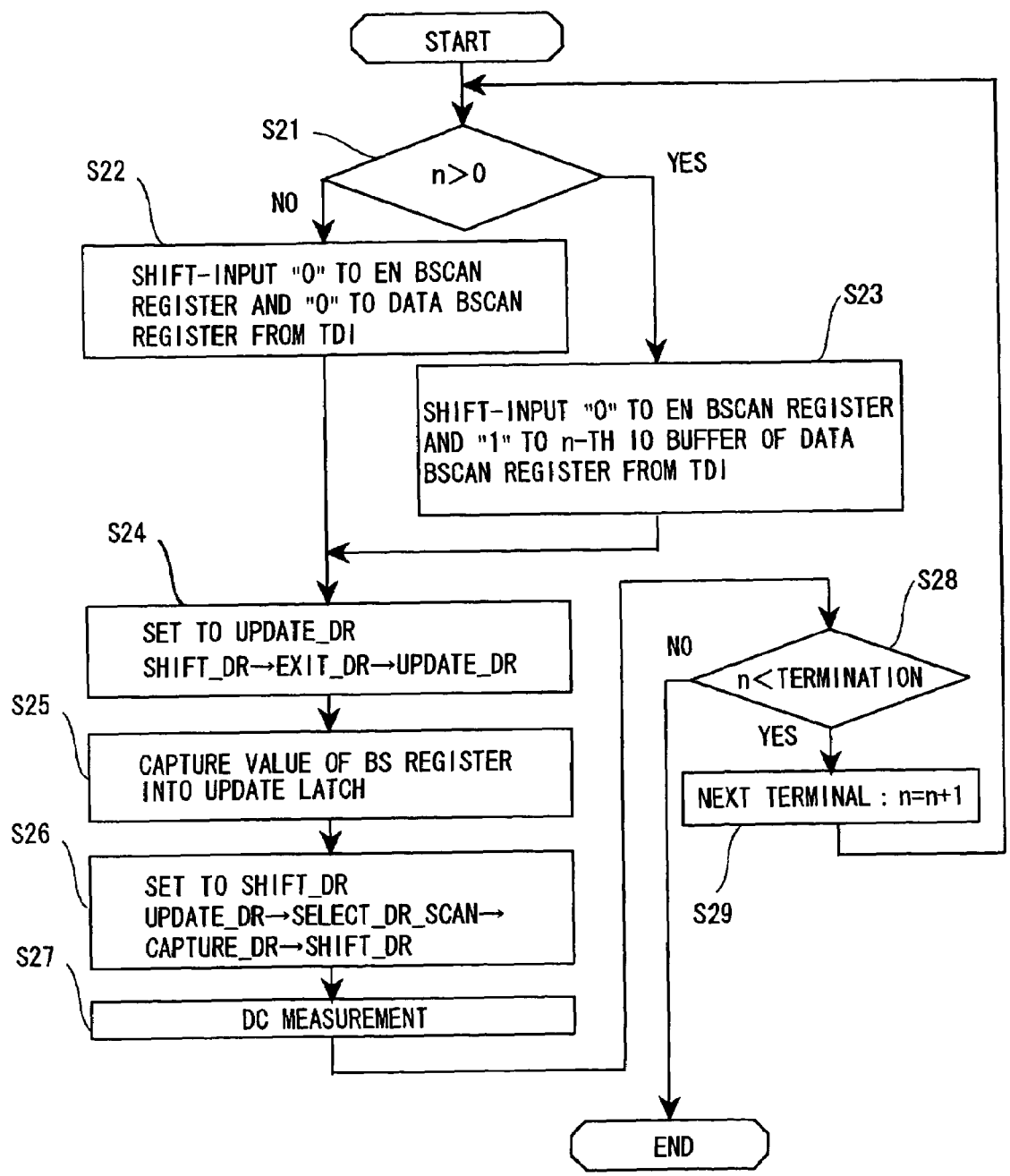
FIG. 4 is a flowchart showing a detail of DC test on each bidirectional buffer according to the first embodiment of the invention.

The test method of this embodiment is described hereinbelow. FIG. 3 is a flowchart showing DC test operation according to this embodiment. FIG. 4 is a flowchart showing a detail of DC test (S9 and S11 of FIG. 3) in each bidirectional buffer. FIG. 5 is a view showing a truth table of the signals input to the circuits shown in FIG. 2. The operation shown in the flowchart of FIG. 4 is the same as the operation according to a related art. In the following description, the external terminals IO1, IO2 and IO3 which are respectively connected to the bidirectional buffers 20a, 20b and 20c are gathered into one group, thus referred to as an integration target terminal group.

Figure 6:
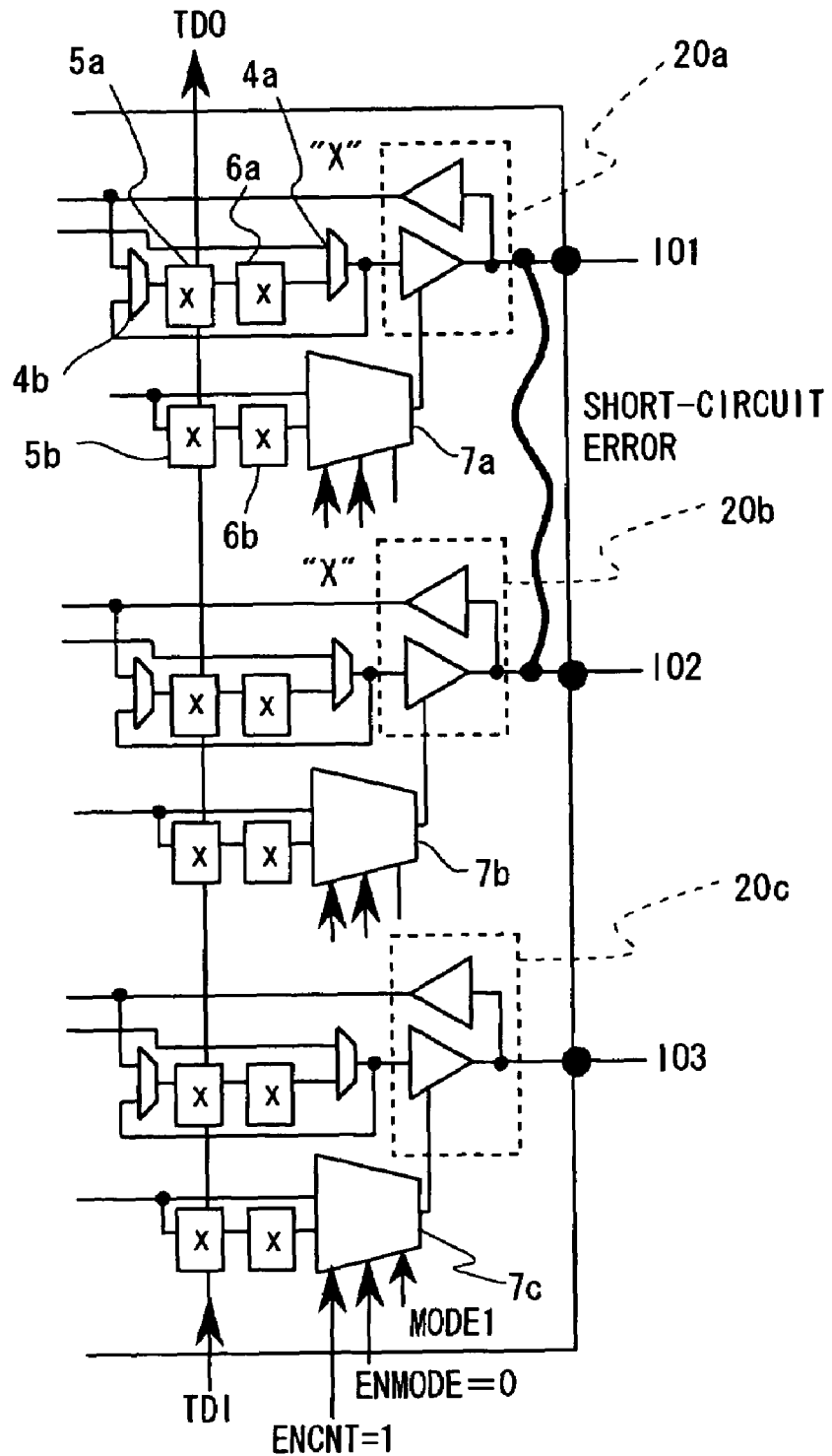
Figure 7:
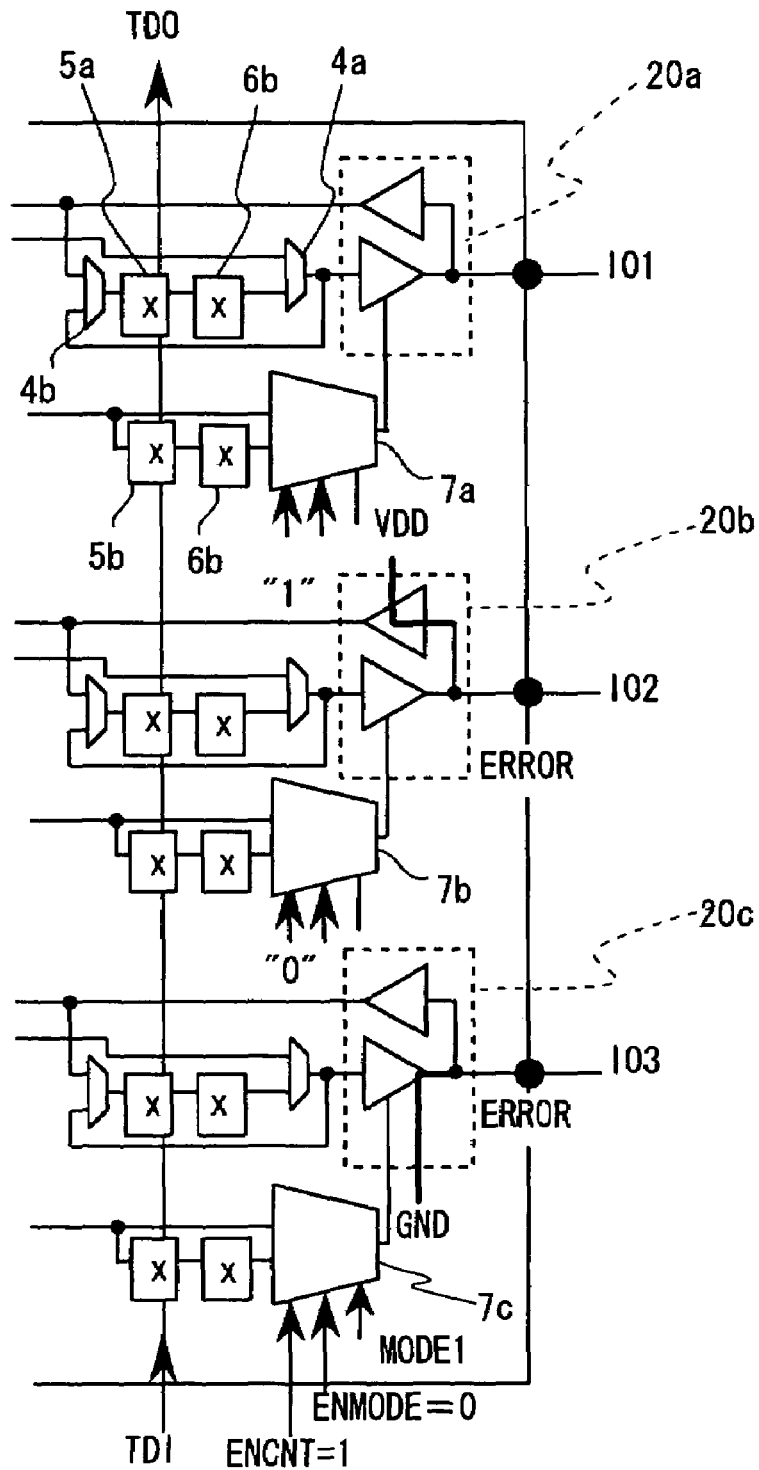

First, the terminals (IO1, IO2 and IO3) in the integration target terminal group are connected to a jig tool for open (S1). This process thereby implements the following test with the terminals in the integration target terminal group being not integrated but in Open state. Initially, the signals are set to the asynchronous EN control switch signal ENMODE=0 and the asynchronous EN I/O control signal ENCNT=1, so that the bidirectional buffers 20a to 20c are asynchronously fixed to output mode by the asynchronous EN controllers 7a to 7c and power is turned ON (S2). FIGS. 6 and 7 show a circuit in this state.

Figure 8:
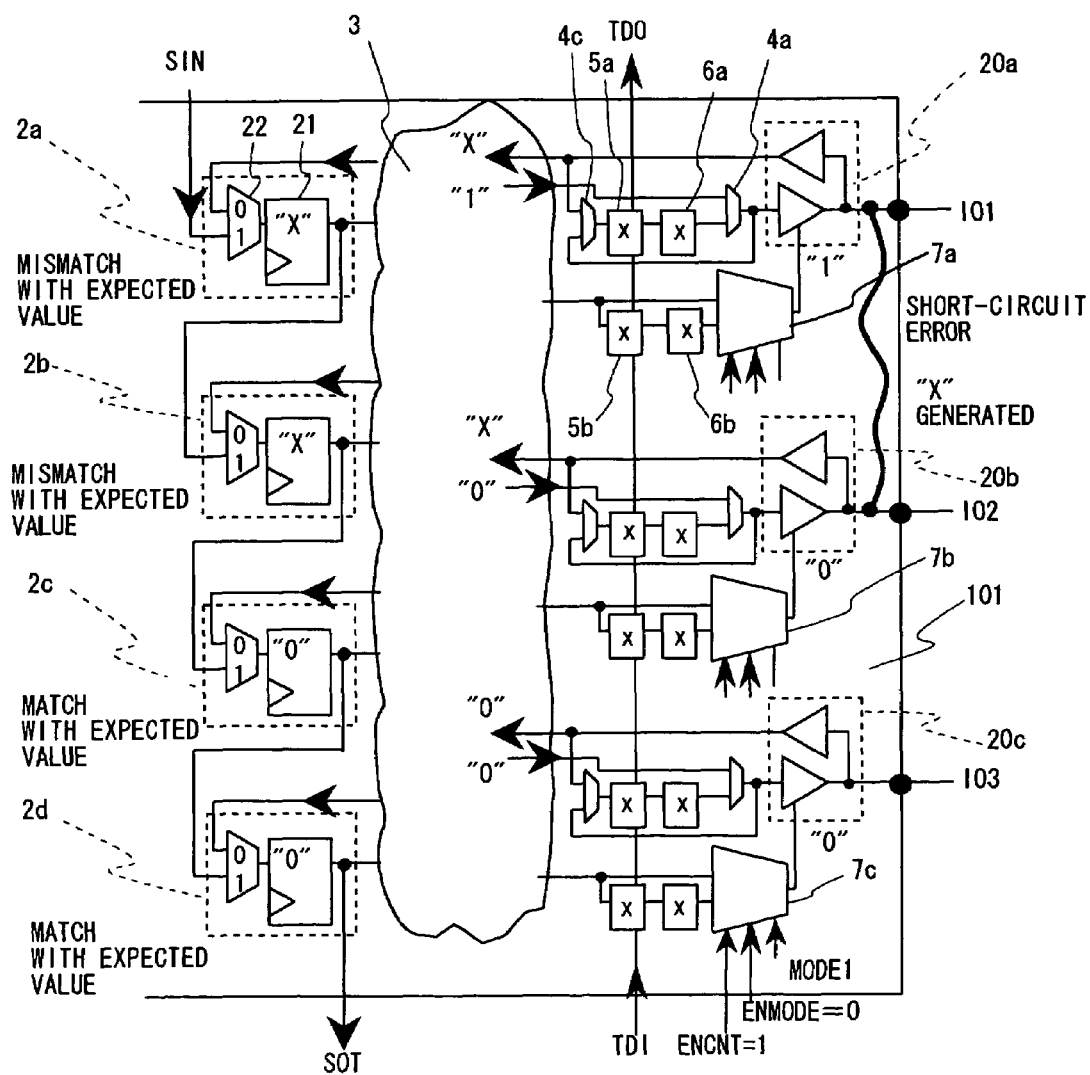
FIG. 8 is a circuit diagram showing a case of detecting short-circuit error using a SCAN circuit according to the first embodiment of the invention.
Figure 9:
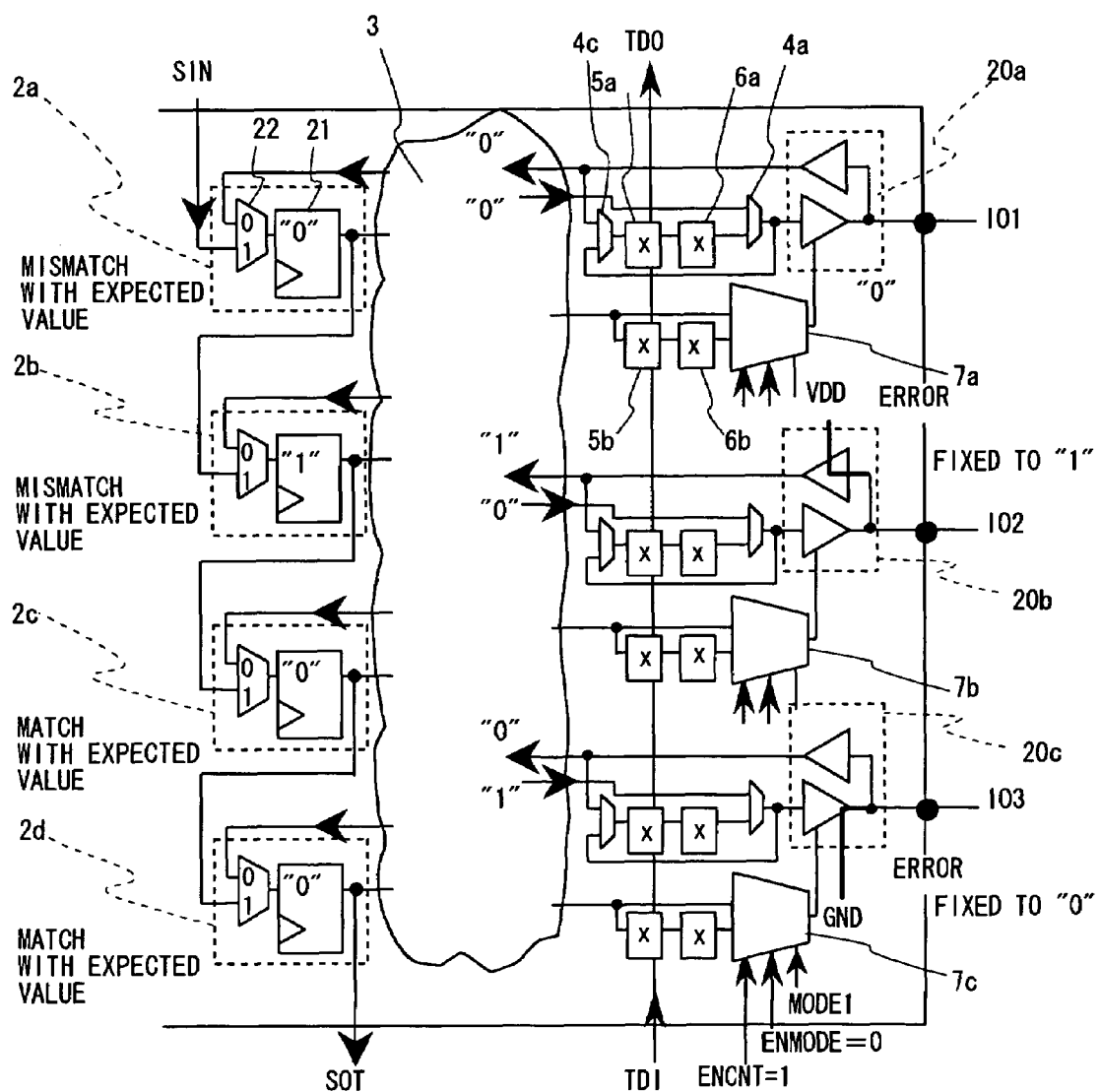
FIG. 9 is a circuit diagram showing a case of detecting multiple errors using a SCAN circuit according to the first embodiment of the invention.

In this state, functional test of SCAN or the like is implemented (S3). FIG. 8 is a circuit diagram showing the case of detecting short-circuit error using the SCAN circuit in this embodiment. FIG. 9 is a circuit diagram showing the case of detecting multiple errors using the SCAN circuit in this embodiment. The controllers of the selectors 4a to 4d are not illustrated in FIGS. 8 and 9.

First, it is tested whether short-circuit error and degeneracy error, which is the error where a logic is fixed to "1" or "0"

without change occur at the external IO1. FIG. 8 shows the example where the external terminals IO1 and IO2 are short-circuited and the external terminal IO3 is normal. In the test of detecting presence or absence of short-circuit, the SCAN-FF 2a, 2b, 2c and 2d are activated to perform SCAN operation so as to transmit "1" to the bidirectional buffer 20a of the external terminal IO1 and transmit "0" to the bidirectional buffers 20b and 20c of the external terminals IO2 and IO3, respectively, through the combinational circuit 3. Since the external terminal IO1 is short-circuited with the external terminal IO2, the logic value turning back to the combinational circuit 3 from the bidirectional buffer 20a of the external terminal IO1 is an indefinite value "X" (which should be "1" normally), and the logic value turning back from the bidirectional buffer 20b of the external terminal IO2 is also an indefinite value "X" (which should be "0" normally). The logic value turning back from the bidirectional buffer 20c of the external terminal IO3 is "0".

The outputs of the bidirectional buffers 20a, 20b and 20c are read into the SCAN-FF 2a, 2b, 2c and 2d through the combinational circuit 3 and output through the SCAN data output terminal SOT by SCAN operation. Based on the logical mismatch between the output value and an expected value, presence or absence of short-circuit error is detected for defect determination. If there is no error, the output value (=expected value) should be "1", "0", and "0". In this example, the output values are "X", "X" and "0" and thus mismatch with the expected values, thereby determining to be defective. This is sequentially performed on the external terminals of all the integration target terminal groups.

FIG. 9 is a view showing a case where a plurality of degeneracy errors occur in the same integration target terminal group or where multiple errors occur in the integration target terminal group. In this example, the LSI external terminal IO2 has an error that the logic is fixed to "1", the external terminal IO3 has an error that the logic is fixed to "0", and only the external terminal IO1 is normal. In this condition, if the SCAN-FF 2a, 2b, 2c and 2d performs SCAN operation to transmit "0" to the bidirectional buffers 20a and 20b of the external terminals IO1 and IO2, respectively, and "1" to the bidirectional buffer 20c of the external terminal IO3 through the combinational circuit 3, the logic turning back to the combinational circuit 3 is "0" from the bidirectional buffer 20a of the external terminal IO1, "1" (which should be "0" normally) from the bidirectional buffer 20b of the external terminal IO2, and "0" (which should be "1" normally) from the bidirectional buffer 20c of the external terminal IO3 because of the error that fixes the logic to "1" occurring in the external terminal IO2 and the error that fixes the logic to "0" occurring in the external terminal IO3.

The outputs of the bidirectional buffers 20a, 20b and 20c are read into the SCAN-FF 2a, 2b, 2c and 2d through the combinational circuit 3 and output through the SCAN data output terminal SOT by SCAN operation. Detection of mismatch between the output value and an expected value enables defect determination. If no error is present, the output values should be equal to the expected values "0", "0", "1". In this example, however, the output values are "0", "1", "0", which are not match with the expected values, thus being defective. When the functional test of Step S3 finds short-circuit error, degeneracy error and multiple errors, the circuit is determined to be defective, and the defective circuit is removed to extract non-defective circuits only.

Since the combinational circuit 3 is typically disposed between the SCAN-FF and the bidirectional buffer, the necessary number of SCAN-FF does not depend on the number of bidirectional buffers but is arbitrary, and the set value and the number of SCAN-FF for inputting a desired value to the bidirectional buffer vary according to the LSI external terminals to be tested. Further, SCAN-FF for reading the output value of the bidirectional buffer is not necessarily the same as SCAN-FF used for inputting a desired value to the bidirectional buffer, including their numbers.

Referring back to the flowchart of FIG. 3, after completing the functional test such as SCAN test including operational verification of the bidirectional buffer described above, the power is turned OFF once (S4). Then, the terminals of the integration target terminal group are connected to the integration jig tool 32 for integration (short-circuit) (S5). Then, as shown in FIG. 5, the signals are set to the asynchronous EN control switch signal ENMODE=0 and the asynchronous EN I/O control signal ENCNT=0, thereby asynchronously fixing to input mode by the asynchronous EN controllers 7a to 7c, and power is turned ON (S6).

Figure 10:
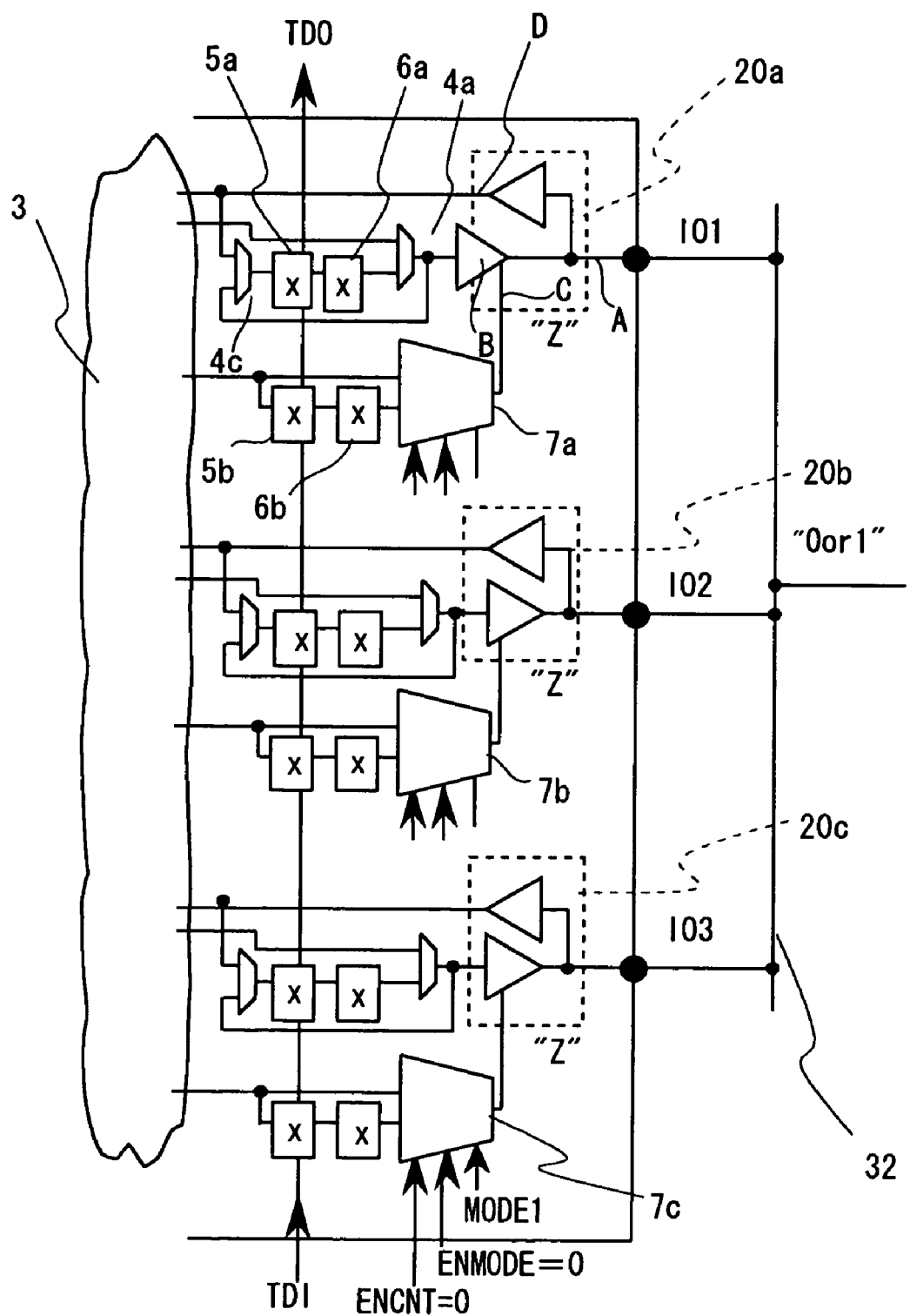

FIG. 10 shows a circuit in this state. The terminals in the integration target terminal group are all set to input mode and no logic defect including shot-circuit error and multiple errors occurs in the bidirectional buffers 20a, 20b and 20c. Therefore, it is possible to supply the logic of "0" or "1" from the LSI tester side to ensure stable state.

Then, the BSCAN circuit is set to Extest mode (S7). Extest mode (instruction) is the mode for disconnecting the LSI internal circuit and the integration terminal group (I/O terminals) and outputting a signal through an external terminal to implement testing. In this mode, the LSI combinational circuit 3 is separated from the bidirectional buffers 20a to 20c at each selector. Then, a set value is shift-input (Shit_DR) to the BSCAN registers 5b and 5a through the BSCAN data input terminal TDI. Then, the set value shirt-input (Shit_DR) to the BSCAN register 5b is read into the Update latch 6b (Update_DR) and input to the EN input terminals C of the bidirectional buffers 20a to 20c. Alternatively, the value output through the data output terminal D of the bidirectional buffers 20a to 20c is captured (Capture_DR) into the BSCAN register 5a through the selector 4c, and the value of the BSCAN register 5a is sequentially shift-output (Shift_DR) to the terminal TDO. The BSCAN data input terminal TDI is a terminal for inputting a set value to the BSCAN register from the outside of LSI, and the terminal TDO is a terminal for outputting the value of the BSCAN register 5a to the outside of LSI.

After setting Extest mode and disconnecting the combinational circuit 3 and the bidirectional buffers 20a to 20c, the value of the BSCAN register 5b is set to the value for setting each EN control of the bidirectional buffers 20a to 20c of the integration terminals to input mode (S9). Specifically, initial settings are set to: n=0 (n is a terminal of verification target; 1 to N(=3)), termination=0 (termination is "n" as termination condition) to enter Shift-DR state.

More specifically, Step S21 in FIG. 4 determines whether to perform initial settings and the process proceeds to S22 in this example. Then, the process shift-inputs "0" to all the EN side BSCAN registers 5b and "0" to all the data side BSCAN registers 5a through the BSCAN data input terminal TDI. Then, the TAP mode is switched from Shift_DR, then Exite_DR to Update_DR to thereby set the state to Update_DR mode (S24). The values of the BSCAN registers 5a and 5b are then captured into the Update latches 6a and 6b, respectively (S25). Further, the TAP mode is switched from Update_DR, Select_DR_scan, Capture_DR to Shift_DR to thereby set the state to Shift_DR mode (S26). All of the bidirectional buffers 20a to 20c are thereby set to input mode.

Then, the signals of the synchronous EN controllers 7a to 7c are set to: the asynchronous EN control switch signal ENMODE=1 and the asynchronous EN I/O control signal ENCNT=0, so that the control that a synchronously fixes to input mode is released. Then, the initial settings are set to n=1 and termination=target terminal number N, and the mode is switched into the control of the BSCAN circuit (S10). After that, DC test of each bidirectional buffer is implemented (S11).

The method of DC test on the bidirectional buffers 20a to 20c is the same as a conventional one. Specifically, as shown in FIG. 4, it is determined whether to perform initial settings (S21). In this example, because the initial value n=1, the process proceeds to Step S23. Then, the set value is sequentially shift-input to the BSCAN register through the BSCAN data input terminal TDI so that only the EN input terminal C of the bidirectional buffer which is connected to the test target external terminal is set to ON. Thus, "0" is input to all EN side BSCAN registers 5b, "1" is input to the data side BSCAN register 5a corresponding to the n-th external terminal, and "0" is input to the other data side BSCAN registers 5a.

Figure 11:
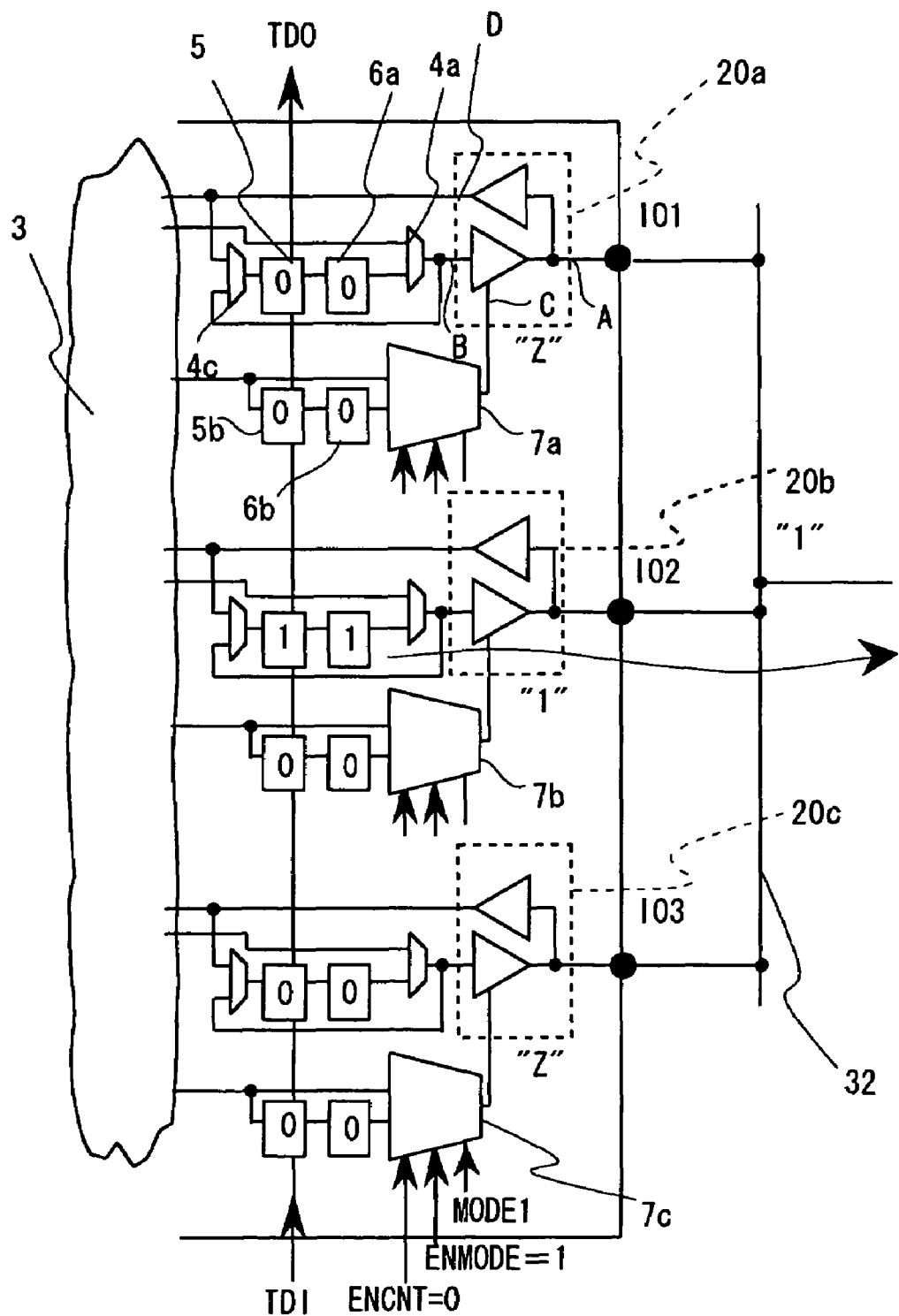
FIG. 11 is a view showing a configuration where "1" is output only from the n-th external terminal.

The TAP mode is then switched from Shift_DR, then Exite_DR, to Update_DR and thereby set to Update_DR mode S24). Then, the values of the BSCAN registers 5a and 5b are captured into the Update latches 6a and 6b (S25). The TAP mode is then switched from Update_DR, Select_DR_scan, Capture_DR to Shift_DR and thereby set to Shift_DR mode (S26). As a result, it is set so that only the n-th external terminal outputs "1". FIG. 11 shows this state. After that, DC measurement is performed (S27) and if the current n value is smaller than a termination value (Yes in S28), the value of n is incremented to implement DC test on the next external terminal included in the integration target terminal group (S29). This is repeated until the DC test on the bidirectional buffer 20 is completed for all the external terminals.

The BSCAN control signal MODE1 is "1" only during Extest mode in BSCAN operation while being "0" during other states as shown in the SCAN test of FIG. 5.

This embodiment limits the terminals of the integration target terminal group to I/O terminals and does not integrate nor connect them to an LSI tester to keep Open state, and sets the bidirectional buffers connected to the integration target terminal group to be asynchronously fixed to output mode. Then, the output value of the bidirectional buffer is set from the inside of LSI. The output value is once turned back to the inside of LSI and then output to the outside of LSI for comparison with an expected value. A logic error in the bidirectional buffer is thereby detected. This method thus enables advance detection and removal of short-circuit between terminals which are undetectable in principle when the terminals are integrated or multiple errors that cause excessive current flow. It further enables the occurrence of excessive current flowing between I/O terminals in the same integration terminal group, thereby preventing breakdown of a jig tool such as a probe card.

Then, the terminals of the integration target terminal group of the LSI which has no short-circuit and multiple errors in the bidirectional buffer within the integration target terminal group are gathered into one and connected to a tester. Upon power on, the EN value of the bidirectional buffer in the integration target terminal group is asynchronously fixed to input mode and a desired value is set to the BSCAN register by BSCAN operation. After setting, the setting of asynchronously fixing the EN value to input mode is released and DC test is implemented by BSCAN operation. Specifically, during a period from powering on to setting a desired set value to the BSCAN register, it is possible to fix the EN value to input mode by the asynchronous EN controllers 7a to 7c and thereby satisfy stable test conditions. After that, the enable value and data value of the bidirectional buffer as a test target in the integration target group are changed to desired values and DC test is implemented.

As described above, this embodiment detects an error before integrating the terminals of an integration target terminal group and thereby enables prevention of excessive current flow and removal of short-circuit error between terminals which is undetectable after integration. Further, it fixes the EN value at the same time as powering on and thereby enables stable testing without being affected by EN value and data value of the bidirectional buffer which are set to unpredictable values after power on.

Second Embodiment

Figure 12:
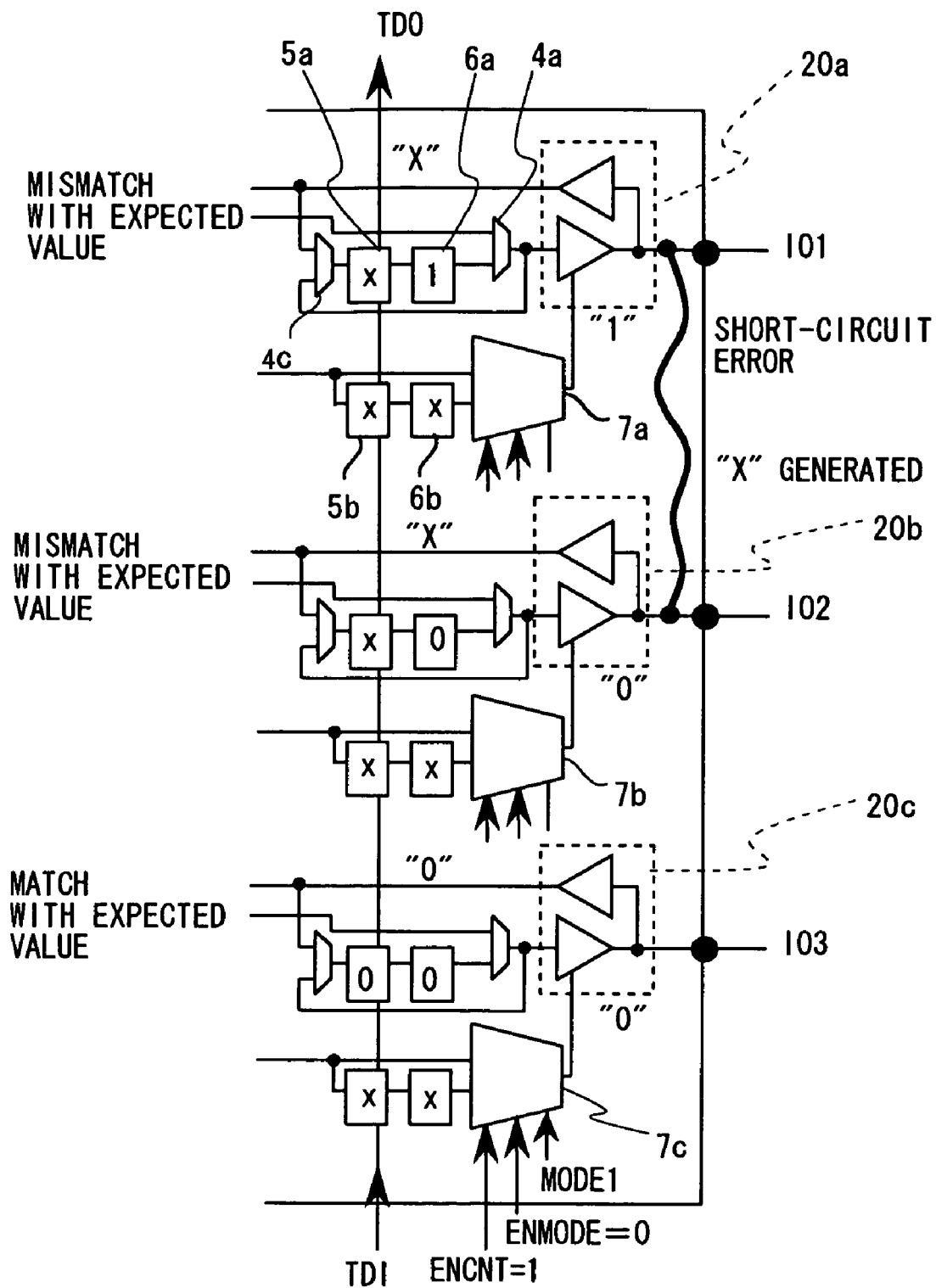
FIG. 12 is a circuit diagram to describe operation for detecting short-circuit error using a BSCAN circuit according to a second embodiment of the invention.
Figure 13:
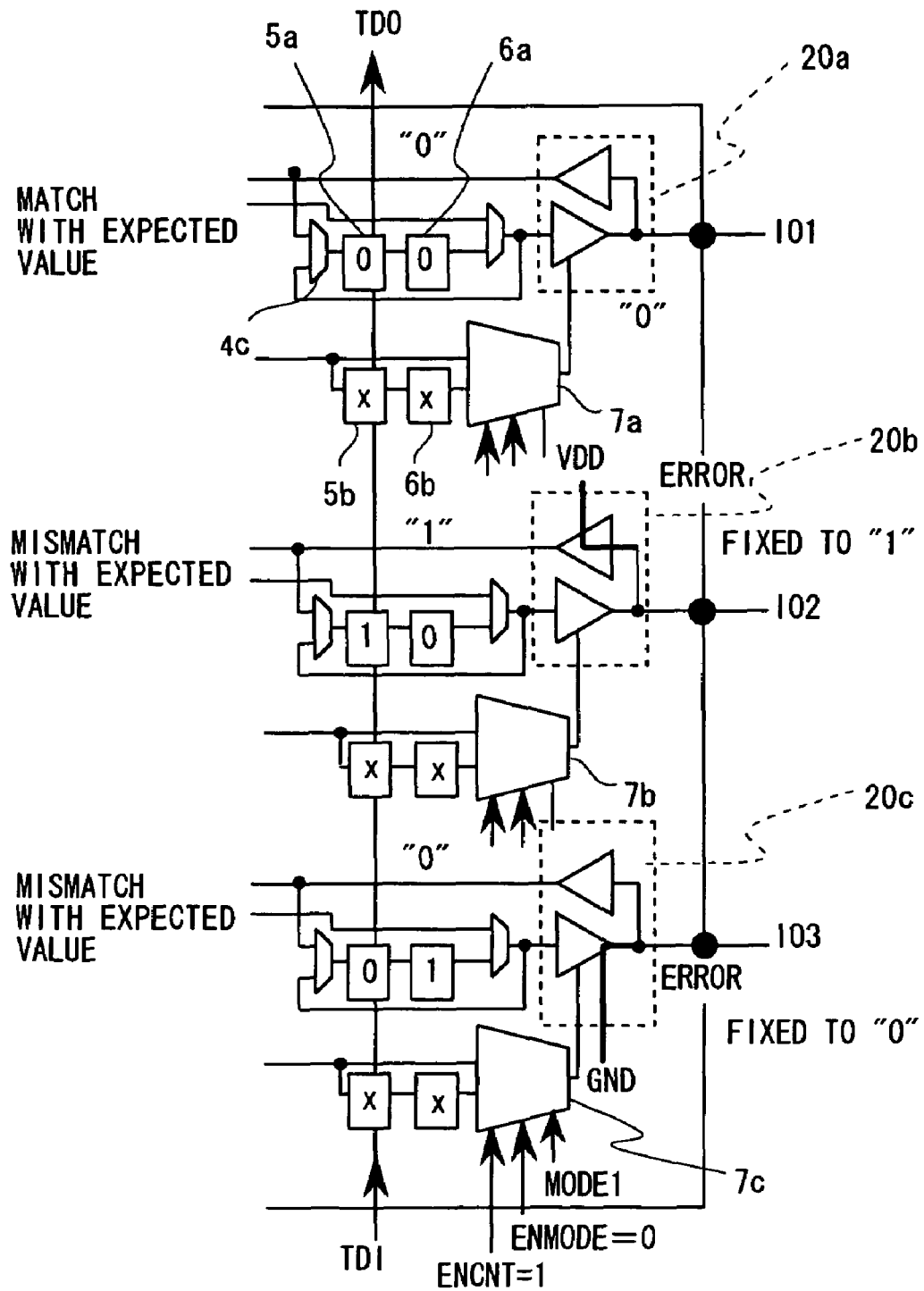
FIG. 13 is a circuit diagram to describe operation for detecting multiple errors using a BSCAN circuit according to the second embodiment of the invention.

Though the above-described first embodiment implements test for detecting short-circuit error and multiple errors on the bidirectional buffer by SCAN-FF, a second embodiment implements the test by BSCAN circuit. Specifically, the functional test such as SCAN in Step S3 of FIG. 3 is executed in Extest mode of BSCAN circuit. FIG. 12 is a circuit diagram for describing the operation to detect short-circuit error using BSCAN circuit according to this embodiment. FIG. 13 is a circuit diagram for describing the operation to detect multiple errors using BSCAN circuit according to this embodiment.

FIG. 12 is a case where the external terminals IO1 and IO2 are short-circuited and the external terminal IO3 is normal. In order to test whether short-circuit error or degeneracy error occurs in the external terminal IO1, functional test is implemented by BSCAN operation. Firstly, the values "1", "0" and "0" are set to the data side BSCAN registers 5a of the external terminals IO1, IO2 and IO3, respectively, through the BSCAN data input terminal TDI by shift operation, and these values are captured into the Update latch 6a by Update operation. The logic values turning back from the Update latch 6a through the bidirectional buffers 20a to 20c and the selector 4c are captured into the corresponding BSCAN register 5a by capture operation (Capture_DR) and sequentially output through the BSCAN data output terminal TDO by shift operation. In this example, the logic value turning back through the bidirectional buffer 20a of the external terminal IO1 is an indefinite value "X" (which should be "1" normally), and the logic value turning back through the bidirectional buffer 20b of the external terminal IO2 is also an indefinite value "X" (which should be "0" normally), which mismatch with expected values. On the other hand, the logic value turning back through the bidirectional buffer 20c of the external terminal IO3 is "0", which matches with an expected value. In this way, this embodiment detects a defect in the external terminals IO1 and IO2 based on the logic mismatch between the output value of the BSCAN data output terminal TDO and the expected value. This is sequentially implemented on all the integration target terminals, thereby performing error determination on all the terminals.

FIG. 13 shows the case where the external terminal IO2 contains an error that the logic is fixed to "1", the external terminal IO3 contains an error that the logic is fixed to "0", and the external terminal IO1 is normal. When testing whether short-circuit error or degeneracy error, which is an error where the logic is fixed to "1" or "0" without change, occurs in the external terminal IO3, the values "0", "0" and "1" are set to the data side BSCAN registers 5a of the external terminals IO1, IO2 and IO3 through the BSCAN data input terminal TDI by shift operation and these values are captured into the Update latch 6a by Update operation. The logic values turning back through the bidirectional buffers 20a to 20c and the selector 4c are captured into the data side BSCAN register 5a by capture operation (Capture_DR) and sequentially output through the BSCAN data output terminal TDO by shift operation. In this example, the output from the bidirectional buffer 20a of the external terminal IO1 is "0", and therefore the output value through the BSCAN data output terminal TDO and the expected value match with each other. On the other hand, the output value through the bidirectional buffer 20b of the external terminal IO2 is "1" (which should be "0" normally) and the output value through the bidirectional buffer 20c of the external terminal IO3 is "0" (which should be "1" normally), which are mismatch with the expected values. In this way, this embodiment detects errors in the external terminals IO2 and IO3 by detecting the logic mismatch between the output value and the expected value. This is sequentially implemented on all the integration target terminals, thereby performing error determination on all the terminals.

The BSCAN control signal MODE1 is "1" only during Extest mode in BSCAN operation while being "0" during other states. In FIGS. 12 and 13, the controllers of the selectors 4a to 4d are not illustrated.

Testing by SCAN-FF as in the first embodiment sometimes fails in efficient pattern creation because of the combinational circuit 3 being interposed. On the other hand, this embodiment disconnects the combinational circuit 3 by Extest mode and implements test without the combinational circuit 3 being interposed, thus having another advantage of easy pattern design.

Third Embodiment

When implementing test to detect short-circuit error or multiple errors of the bidirectional buffers in BSCAN operation according to the second embodiment, it is possible to use another asynchronous EN controller that enables at least the common items and BSCAN (Extest) test shown in FIG. 5.

Figure 14:
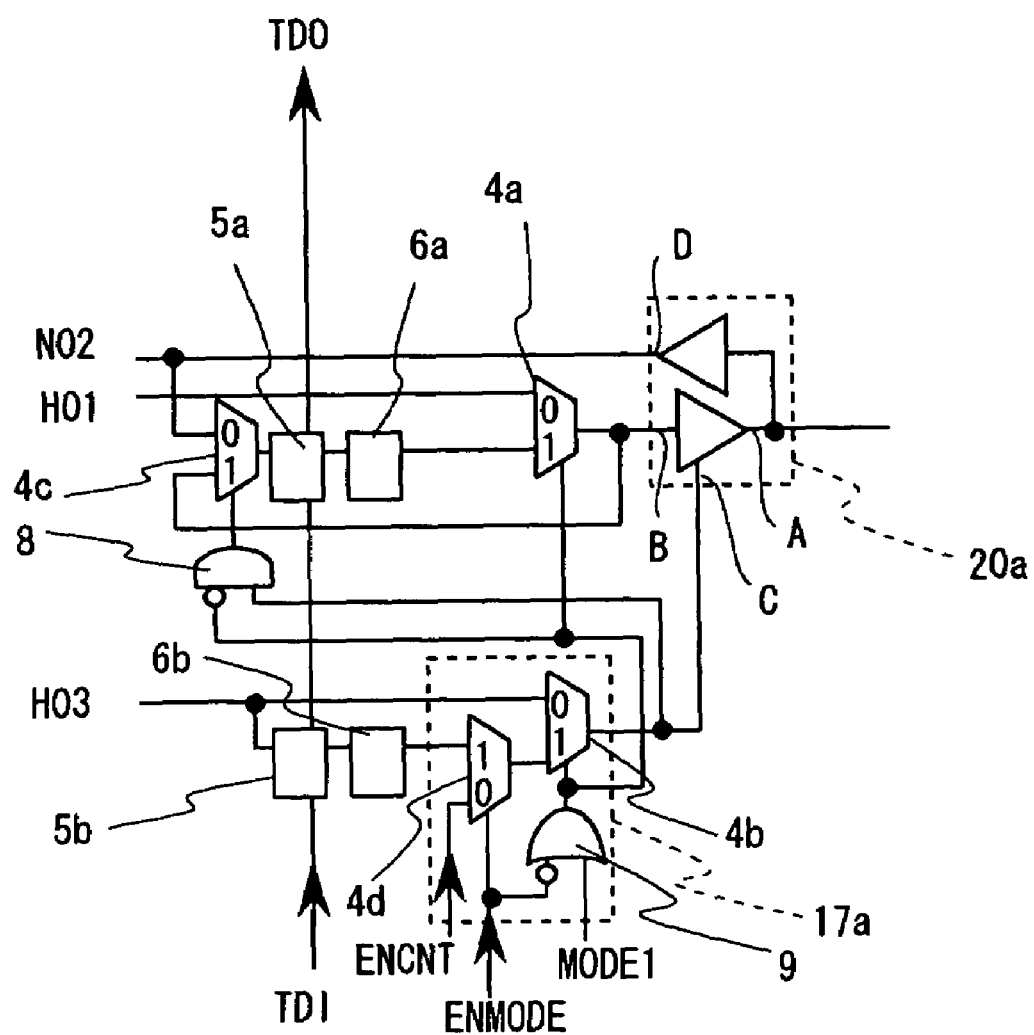
FIG. 14 is a circuit diagram showing an asynchronous controller and its peripheral circuit according to a third embodiment of the invention.

FIG. 14 is a circuit diagram showing an asynchronous controller and its peripheral circuit according to a third embodiment of the invention. The BSCAN control signal MODE1 is supplied to one input (inverting input) of the AND circuit 8 in the first embodiment shown in FIG. 2. In this embodiment, on the other hand, the output of the OR circuit 9 of an asynchronous EN controller 17a is connected to the switching input of the selector 4b and also to one input (inverting input) of the AND circuit 8.

The other elements are the same as those in the first embodiment shown in FIG. 2. The asynchronous EN controller 17a includes the selector 4b, the selector 4d and the OR circuit 9. It receives the asynchronous EN control switch signal ENMODE, the asynchronous EN I/O control signal ENCNT, and the BSCAN control signal MODE1.

In the selector 4b, the selection input with the switching input value "0" is connected to the output HO3 of the internal logic circuit 2, the selection input with the switching input value "1" is connected to the output of the selector 4d, the switching input is connected to the output of the OR circuit 9, and the output is connected to the EN input C of the bidirectional buffer 20a and one input (non-inverting input) of the AND circuit 8.

In the OR circuit 9, one input (inverting input) thereof receives the asynchronous EN control switch signal ENMODE, and the other input (non-inverting input) thereof receives the BSCAN control signal MODE1. As described, the output of the OR circuit 9 is connected to the switching input of the selector 4b and one input of the AND circuit 8.

In the selector 4d, the selection input with the switching input value "0" receives the asynchronous EN I/O control signal ENCNT, the selection input with the switching input value "1" is connected to the output of the EN side Update latch 6b, and the switching input receives the asynchronous EN control switch signal ENMODE. The other elements are the same as those in the second embodiment and operate in the same manner.

This embodiment has the same advantages as the first embodiment. It is thus capable of detecting short-circuit between terminals, which has been undetectable conventionally, and multiple errors causing excessive current flow in advance. Further, the provision of the asynchronous EN controller 17 allows the EN value to be fixed to input mode at the same time as power-on, thereby satisfying stable test conditions. Furthermore, it is possible to detect errors by using BSCAN circuit instead of SCAN-FF as in the second embodiment.

Other Embodiments

Figure 15:
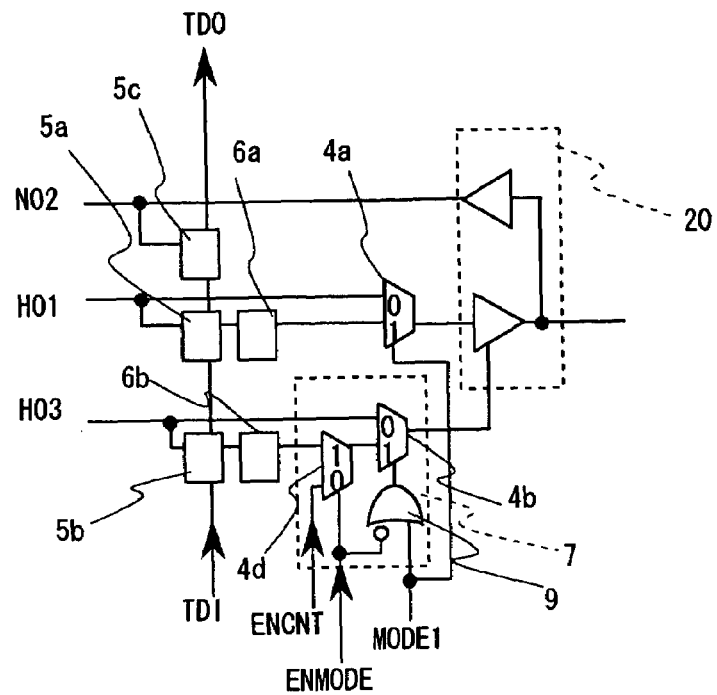
FIG. 15 is a circuit diagram showing an alternative example of the BSCAN circuit section of FIG. 2.
Figure 16:
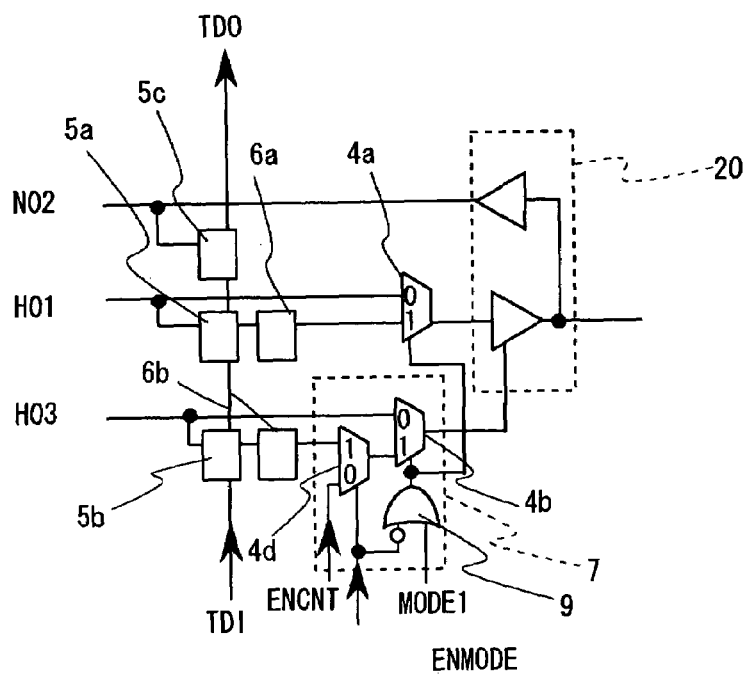
FIG. 16 is a circuit diagram showing an alternative example of the BSCAN circuit shown in FIG. 14.
Figure 17:
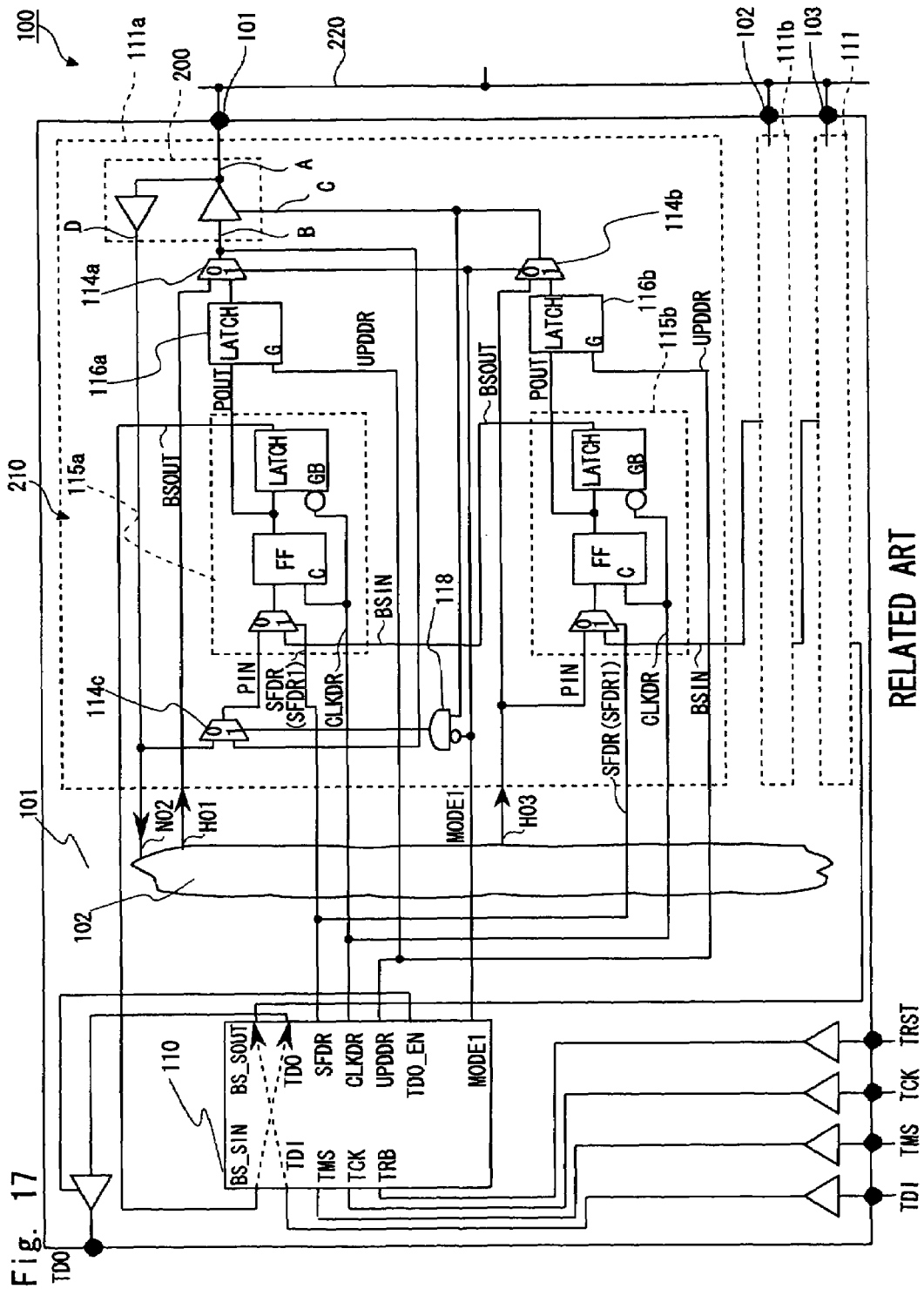
FIG. 17 is a circuit diagram showing the entire part of a boundary scan (BSCAN) circuit of a related art.
Figure 18:
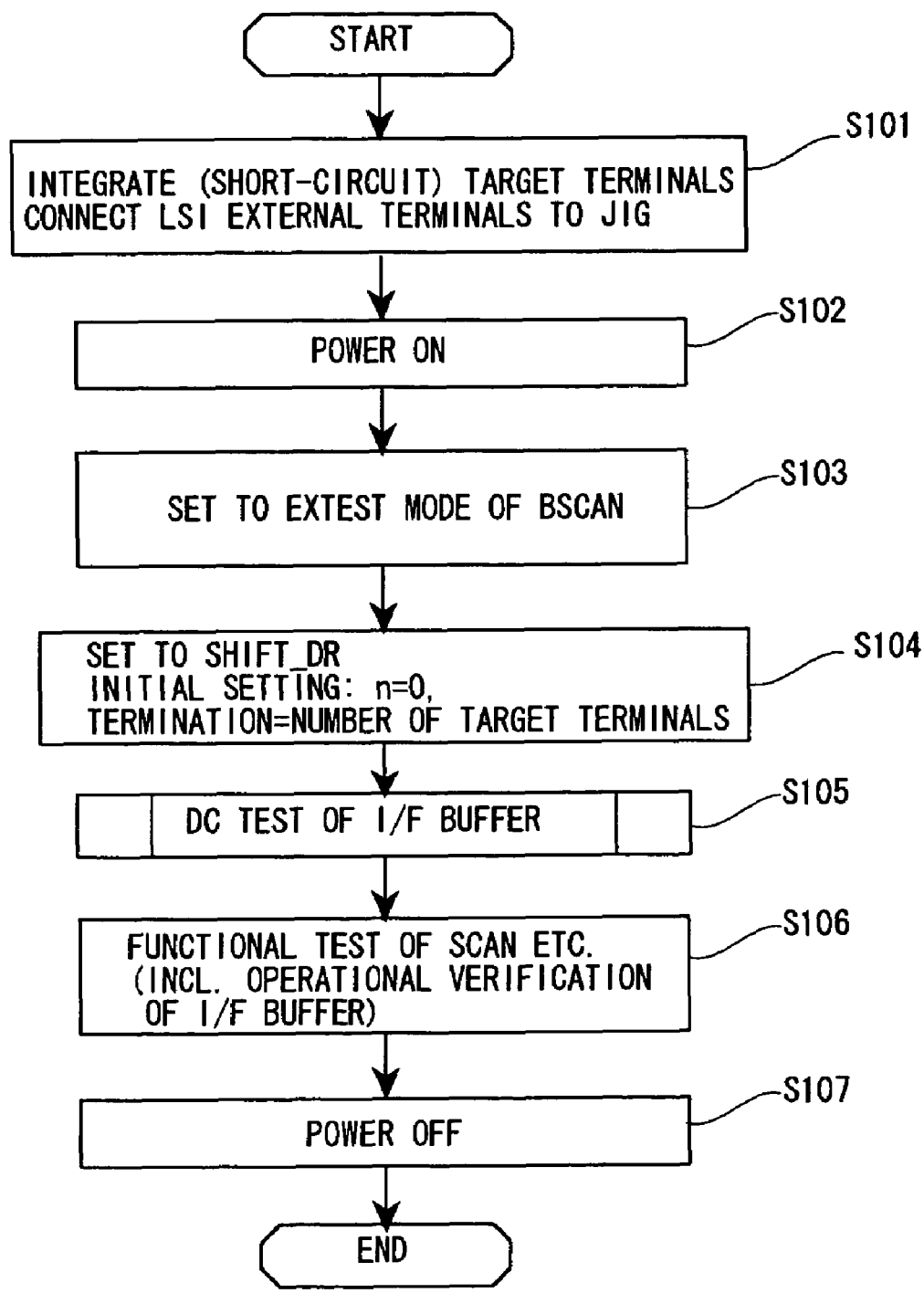
FIG. 18 is a flowchart showing test operation of a related art.
Figure 19:
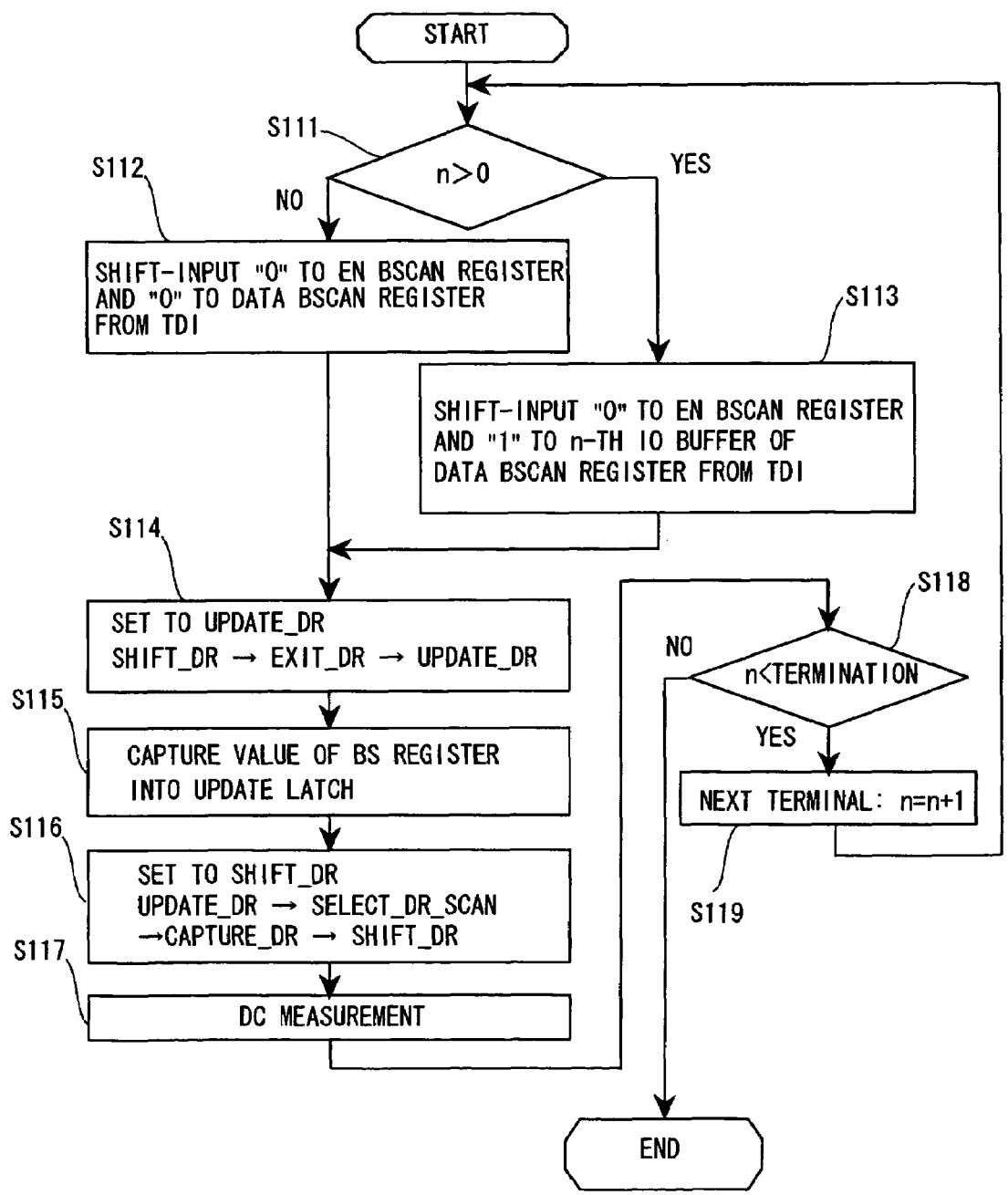
FIG. 19 is a flowchart showing a detail of Step S105 in FIG. 18.
Figure 20:
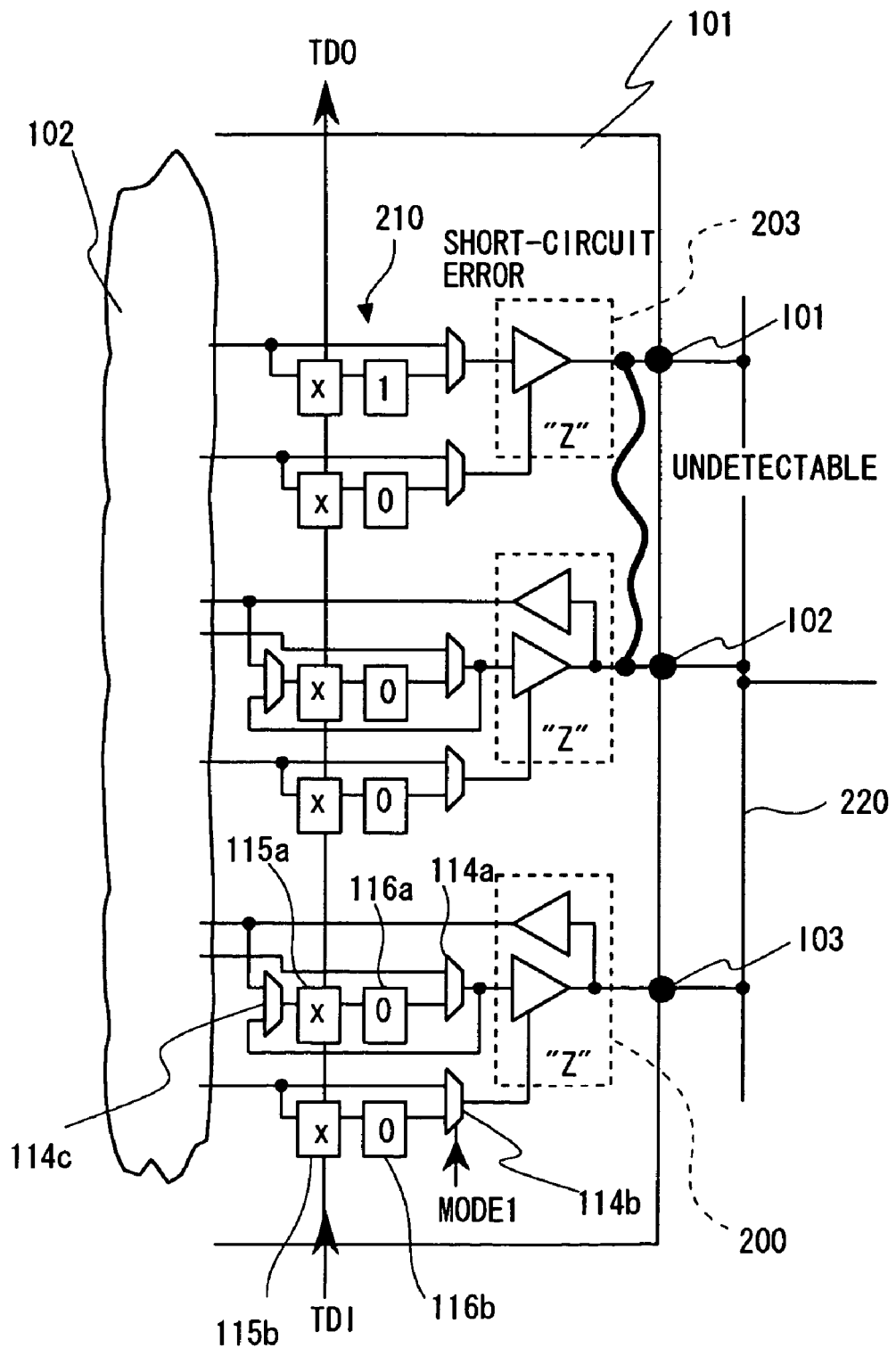
FIG. 20 is a view to describe test operation of a related art.
Figure 21:
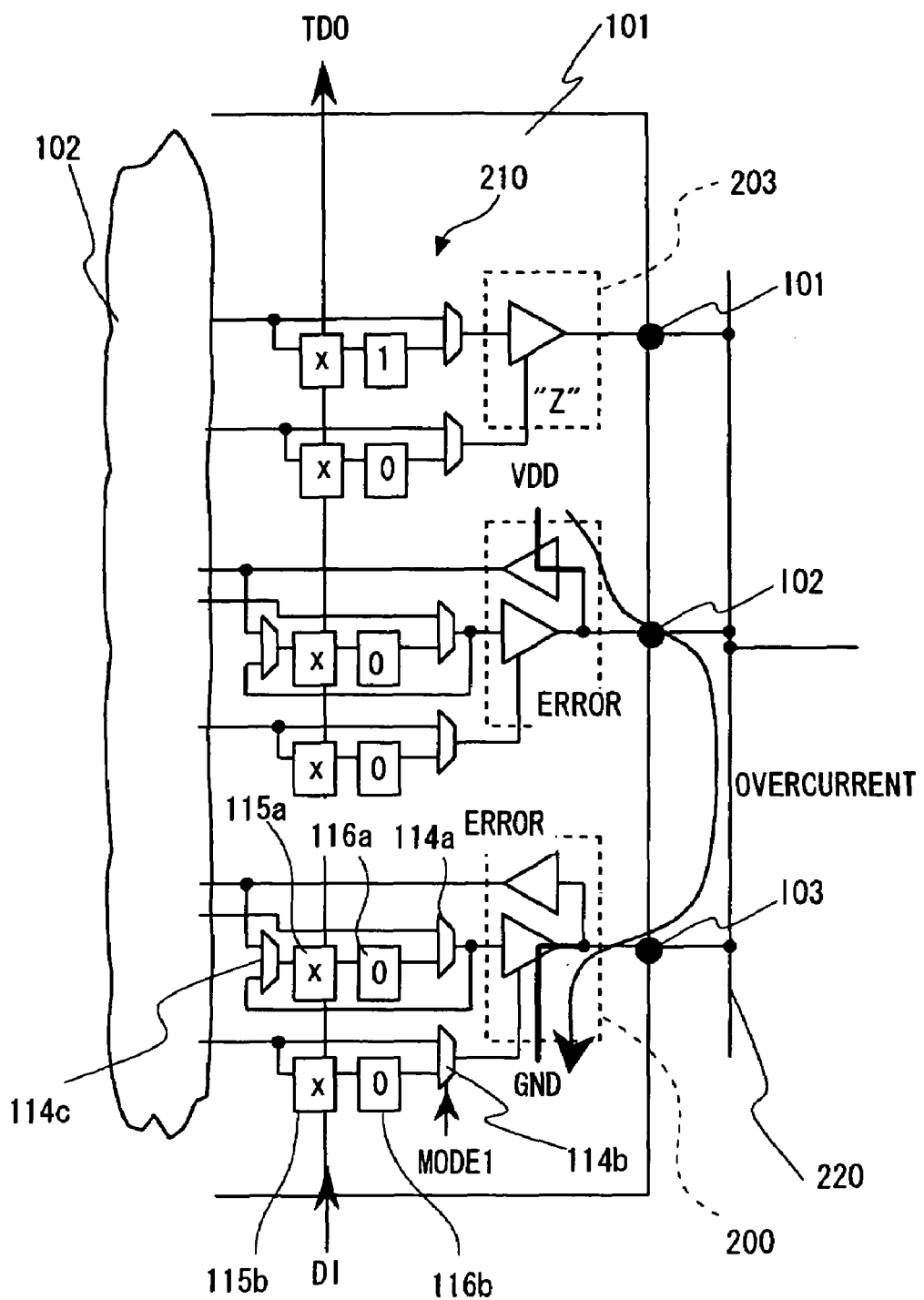
FIG. 21 is a view to describe test operation of a related art.
Figure 22:
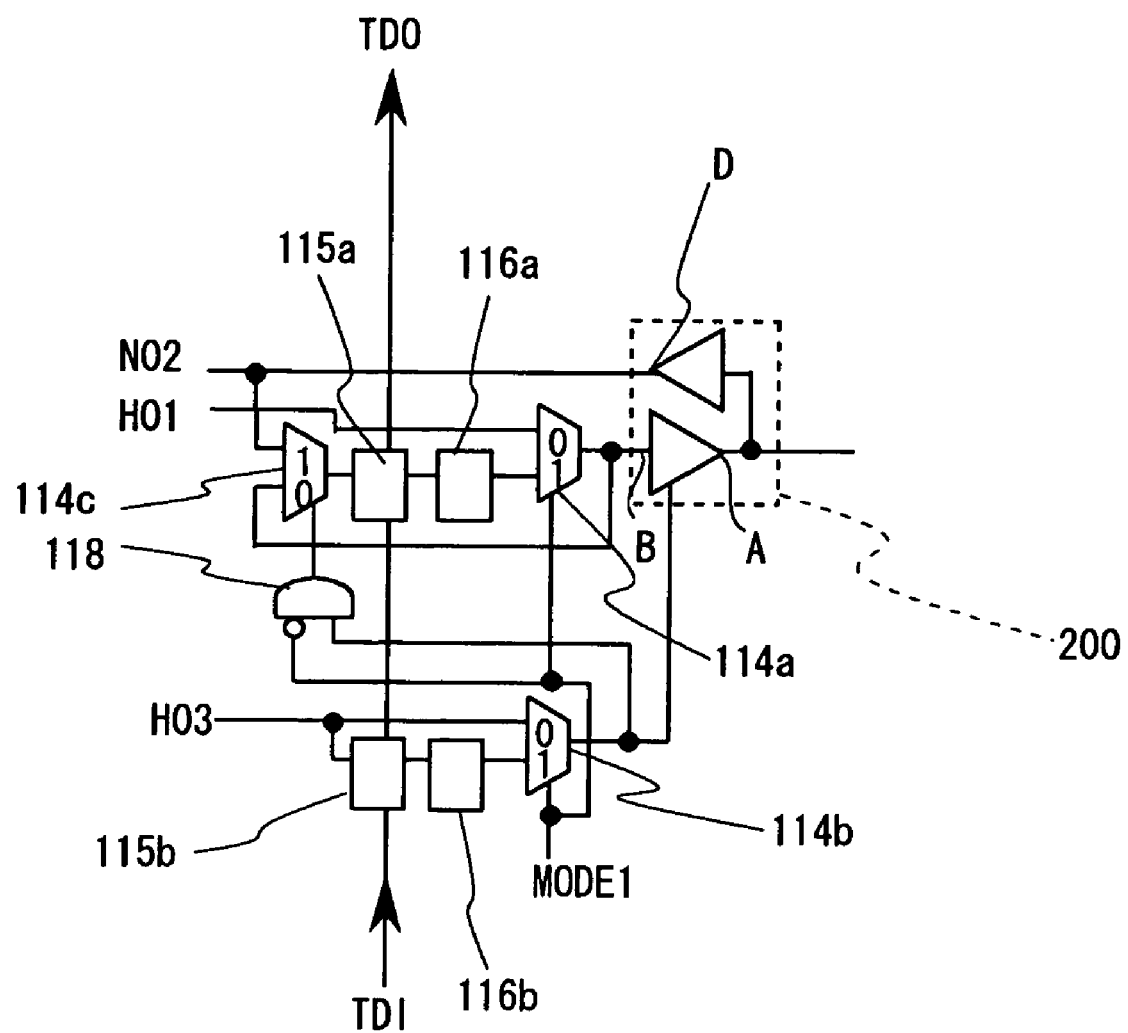
FIG. 22 is a view showing a detail of a BSCAN circuit of a bidirectional buffer of a related art.

Though each BSCAN circuit has two BSCAN registers in the above-described embodiments, it may have three BSCAN registers. FIGS. 15 and 16 are circuit diagrams showing alternative examples of BSCAN circuit section, which correspond to FIG. 2 and FIG. 14, respectively.

As shown in FIG. 15, the LSI of this embodiment has a BSCAN register 5c instead of the LSI selector 4c and the AND circuit 8 shown in FIG. 2. The BSCAN resister 5c receives the output of the bidirectional buffer 20 and selectively outputs either the output of the bidirectional buffer 20 or the output of the BSCAN register 5a. The other elements are the same as those in FIG. 2.

Further, as shown in FIG. 16, it is possible to use the BSCAN resister 5c as a third BSCAN circuit instead of the LSI selector 4c and the AND circuit 8 shown in FIG. 14. The BSCAN resister 5c receives the output of the bidirectional buffer 20 and selectively outputs either the output of the bidirectional buffer 20 or the output of the BSCAN register 5a. The other elements are the same as those in FIG. 14. Since this embodiment uses three BSCAN registers, though a time required to set the set values to the BSCAN circuits is longer than the one in the above-described embodiments, it is able to fix the bidirectional buffer to input mode during a period from powering on to setting set values to the BSCAN circuits by the asynchronous EN controller 17, thus enabling testing under stable conditions.

It is apparent that the present invention is not limited to the above embodiment that may be modified and changed without departing from the scope and spirit of the invention.

What is claimed is:

1. A test method of a semiconductor device having bidirectional buffers connected to a boundary scan circuit, said method comprising:
    detecting a logic error by setting the bidirectional buffers uniformly to an output mode by an asynchronous setting circuit for asynchronously setting the bidirectional buffers to an input mode or to said output mode;
    if there is no logic error, integrating a plurality of input/output terminals connected to the bidirectional buffers and fixing the bidirectional buffers with the integrated input/output terminals uniformly to said input mode by the asynchronous setting circuit;
    setting a set value for setting the bidirectional buffers to a desired enable state to the boundary scan circuit and releasing the uniform input mode by the asynchronous setting circuit; and implementing a direct current (DC) test by the boundary scan circuit with the input/output terminals being integrated.

2. The test method of the semiconductor device according to claim 1, wherein the detecting a logic error by setting the bidirectional buffers uniformly to the output mode detects a logic error of each bidirectional buffer through an internal circuit by using a scan flip-flop.

3. The test method of the semiconductor device according to claim 2, wherein the detecting a logic error by setting the bidirectional buffers uniformly to the output mode detects a short-circuit error between the bidirectional buffers and/or a degeneracy error in the bidirectional buffers.

4. The test method of the semiconductor device according to claim 1, wherein the detecting a logic error by setting the bidirectional buffers uniformly to the output mode disconnects a connection between an internal circuit and the bidirectional buffers and detects a logic error by the boundary scan circuit.

5. The test method of the semiconductor device according to claim 4, wherein the detecting a logic error by setting the bidirectional buffers uniformly to the output mode detects a short-circuit error between the bidirectional buffers and/or a degeneracy error in the bidirectional buffers.

6. The test method of the semiconductor device according to claim 1, wherein the detecting a logic error by setting the bidirectional buffers uniformly to the output mode detects a short-circuit error between the bidirectional buffers and/or a degeneracy error in the bidirectional buffers.

7. A semiconductor devices comprising:
an internal circuit;
a plurality of bidirectional buffers; and
a boundary scan circuit connected between the internal circuit and the plurality of bidirectional buffers, wherein the boundary scan circuit comprises an asynchronous setting circuit for asynchronously setting the bidirectional buffers to an input mode or an output mode.

8. The semiconductor device according to claim 7, wherein the asynchronous setting circuit controls the bidirectional buffers by asynchronously switching between the input mode and the output mode in accordance with two or more control signals.

9. The semiconductor device according to claim 8, wherein the asynchronous setting circuit controls the bidirectional buffers by asynchronously switching between the input mode and the output mode in accordance with an asynchronous enable switch signal for controlling whether to asynchronously set to an enable state and an asynchronous enable input/output control signal for controlling switching between the input mode and the output mode when setting to the enable state.

10. The semiconductor device according to claim 9, wherein the boundary scan circuit further comprises:
a first boundary scan register and a first latch for receiving a set value for setting the input mode or the output mode of the bidirectional buffers; and
a second boundary scan register and a second latch for receiving an input value to the bidirectional buffers, and the asynchronous setting circuit is connected to an output of the internal circuit and the first latch, and when an asynchronous setting function of the asynchronous setting circuit is OFF by an asynchronous enable switch signal for controlling whether to asynchronously set to the enable state, the asynchronous setting circuit selectively outputs the output of the internal circuit or the set value of the first latch, and the input value of the second latch or the output of the internal circuit is selectively supplied to the bidirectional buffers in accordance with a mode switching signal for switching the bidirectional buffers between input mode and output mode.

11. The semiconductor device according to claim 10, further comprising:
a first selector connected to the internal circuit and the second latch, for selectively outputting the input value to the bidirectional buffers; and
a second selector connected to an output of the bidirectional buffer and an output of the first selector, for selectively outputting an output value to the second boundary scan circuit,
wherein the first selector and the second selector perform a selective output in accordance with the mode switch signal.

12. The semiconductor device according to claim 10, further comprising:
a first selector connected to the internal circuit and the second latch, for selectively outputting the input value to the bidirectional buffer; and
a third boundary scan register connected to an output of the bidirectional buffer, wherein the first selector performs a selective output in accordance with the mode switch signal.

13. The semiconductor device according to claim 8, wherein the boundary scan circuit further comprises:
a first boundary scan register and a first latch for receiving a set value for setting the input mode or the output mode of the bidirectional buffers; and
a second boundary scan register and a second latch for receiving an input value to the bidirectional buffers, and the asynchronous setting circuit is connected to an output of the internal circuit and the first latch, and when an asynchronous setting function of the asynchronous setting circuit is OFF by an asynchronous enable switch signal for controlling whether to asynchronously set to an enable state, the asynchronous setting circuit selectively outputs the output of the internal circuit or a set value of the first latch, and an input value of the second latch or the output of the internal circuit is selectively supplied to the bidirectional buffers in accordance with a mode switching signal for switching the bidirectional buffers between the input mode and the output mode.

14. The semiconductor device according to claim 13, further comprising:
a first selector connected to the internal circuit and the second latch, for selectively outputting the input value to the bidirectional buffer; and
a third boundary scan register connected to an output of the bidirectional buffer, wherein the first selector performs a selective output in accordance with the mode switch signal.

15. The semiconductor device according to claim 13, further comprising:
a first selector connected to the internal circuit and the second latch, for selectively outputting the input value to the bidirectional buffer; and
a third boundary scan register connected to an output of the bidirectional buffer, wherein the first selector performs a selective output in accordance with the mode switch signal.

16. The semiconductor device according to claim 7, wherein the boundary scan circuit further comprises:
a first boundary scan register and a first latch for receiving a set value for setting the input mode or the output mode of the bidirectional buffers; and a second boundary scan register and a second latch for receiving an input value to the bidirectional buffers, and the asynchronous setting circuit is connected to an output of the internal circuit and the first latch, and when an asynchronous setting function of the asynchronous setting circuit is OFF by an asynchronous enable switch signal for controlling whether to asynchronously set to an enable state, the asynchronous setting circuit selectively outputs an output of the internal circuit or a set value of the first latch, and the input value of the second latch or the output of the internal circuit is selectively supplied to the bidirectional buffers in accordance with a mode switching signal for switching the bidirectional buffers between the input mode and the output mode.

17. The semiconductor device according to claim 16, further comprising:
a first selector connected to the internal circuit and the second latch, for selectively outputting the input value to the bidirectional buffers; and
a second selector connected to an output of the bidirectional buffer and an output of the first selector, for selectively outputting an output value to the second boundary scan register,
wherein the first selector and the second selector perform a selective output in accordance with the mode switch signal.

18. The semiconductor device according to claim 16, further comprising:
a first selector connected to the internal circuit and the second latch, for selectively outputting the input value to the bidirectional buffer; and
a third boundary scan register connected to an output of the bidirectional buffer, wherein the first selector performs a selective output in accordance with the mode switch signal.

19. The semiconductor device according to claim 7, wherein a test is implemented by short-circuiting a plurality of terminals to form a connection with a tester.

20. The semiconductor device according to claim 7, wherein the asynchronous setting circuit first sets the bidirectional buffers to the output mode and detects whether a logic error exists in each bidirectional buffer of the plurality of bidirectional buffers,
wherein, if there is an error, the asynchronous setting circuit removes the semiconductor device, and
wherein, if there is no error, a plurality of input/output terminals connected to the plurality of bidirectional buffers are integrated and connected to a tester for a DC test.

* * * * *